(12) United States Patent
Nasu et al.

(10) Patent No.: US 12,278,268 B2
(45) Date of Patent: Apr. 15, 2025

(54) SEMICONDUCTOR DEVICE

(71) Applicant: ROHM CO., LTD., Kyoto (JP)

(72) Inventors: Kentaro Nasu, Kyoto (JP); Takaaki Yoshioka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 538 days.

(21) Appl. No.: 17/640,241

(22) PCT Filed: Sep. 25, 2020

(86) PCT No.: PCT/JP2020/036385
§ 371 (c)(1),
(2) Date: Mar. 3, 2022

(87) PCT Pub. No.: WO2021/065740
PCT Pub. Date: Apr. 8, 2021

(65) Prior Publication Data
US 2022/0344466 A1 Oct. 27, 2022

(30) Foreign Application Priority Data

Sep. 30, 2019 (JP) .................................. 2019-180862

(51) Int. Cl.
*H01L 29/06* (2006.01)
*H01L 29/16* (2006.01)
(Continued)

(52) U.S. Cl.
CPC ...... *H01L 29/0696* (2013.01); *H01L 29/1608* (2013.01); *H01L 29/66068* (2013.01); *H01L 29/7813* (2013.01)

(58) Field of Classification Search
CPC ........... H01L 29/0696; H01L 29/66068; H01L 29/7813; H01L 29/66787; H01L 29/785;
(Continued)

(56) References Cited

U.S. PATENT DOCUMENTS

2006/0071270 A1\* 4/2006 Shibib ................. H01L 21/2253
257/E29.022
2007/0145474 A1\* 6/2007 Annese ............... H01L 29/7834
257/E21.429
(Continued)

FOREIGN PATENT DOCUMENTS

JP H08264764 10/1996
JP 2006100824 4/2006
(Continued)

OTHER PUBLICATIONS

International Preliminary Report on Patentability issued for International Patent Application No. PCT/JP2020/036385, Date of mailing: Apr. 14, 2022, 10 pages including English translation.
(Continued)

*Primary Examiner* — S M Sohel Imtiaz
(74) *Attorney, Agent, or Firm* — HSML P.C.

(57) ABSTRACT

A semiconductor device includes a semiconductor chip having a main surface, a first conductivity type drift layer formed in a surface layer portion of the main surface, a trench gate structure formed in the main surface such as to be in contact with the drift layer, a second conductivity type channel region formed in the drift layer such as to cover a side wall of the trench gate structure, and first and second source/drain regions formed at intervals in a region along the side wall of the trench gate structure in the drift layer such as to oppose each other across the channel region.

19 Claims, 16 Drawing Sheets

(51) Int. Cl.
  *H01L 29/66*   (2006.01)
  *H01L 29/78*   (2006.01)
(58) Field of Classification Search
  CPC ............... H01L 27/088; H01L 29/1037; H01L 29/4236; H01L 29/1608
  See application file for complete search history.

(56) References Cited

U.S. PATENT DOCUMENTS

| | | | |
|---|---|---|---|
| 2011/0284951 A1* | 11/2011 | Ueda | H01L 29/1037 438/270 |
| 2013/0313637 A1* | 11/2013 | Yoshida | H01L 27/0924 257/334 |
| 2015/0087122 A1* | 3/2015 | Yoshimochi | H01L 27/0629 438/237 |
| 2016/0190301 A1* | 6/2016 | Aichinger | H01L 29/7804 257/334 |
| 2017/0207301 A1* | 7/2017 | Harada | H01L 23/53295 |
| 2017/0338336 A1* | 11/2017 | Nasu | H01L 29/16 |
| 2018/0096991 A1* | 4/2018 | Nasu | H01L 27/0255 |
| 2019/0081170 A1* | 3/2019 | Kumagai | H01L 27/088 |
| 2019/0081624 A1* | 3/2019 | Zhang | H01L 29/7813 |
| 2020/0227402 A1* | 7/2020 | Sabui | H01L 29/0615 |
| 2020/0266293 A1* | 8/2020 | Katou | H01L 29/41741 |
| 2020/0273982 A1* | 8/2020 | Ng | H01L 29/407 |
| 2023/0387293 A1* | 11/2023 | Germana-Carpineto | H01L 29/66704 |

FOREIGN PATENT DOCUMENTS

| | | |
|---|---|---|
| JP | 2012004541 | 1/2012 |
| JP | 2013247127 | 12/2013 |

OTHER PUBLICATIONS

International Search Report and Written Opinion issued for International Patent Application No. PCT/JP2020/036385, Date of mailing: Dec. 22, 2020, 8 pages including English translation of Search Report.

* cited by examiner

SEMICONDUCTOR DEVICE

TECHNICAL FIELD

The present invention relates to a semiconductor device including a common source/drain type MISFET (Metal Insulator Semiconductor Field Effect Transistor) in which a source and a drain are integrated.

BACKGROUND ART

Patent Literature 1 discloses a semiconductor device including a vertical gate type MOS (Metal Oxide Semiconductor) transistor which serves as an example of the common source/drain type MISFET. This semiconductor device includes a p-type semiconductor layer (semiconductor chip), a trench gate structure, a plurality of n-type drift layers, and a plurality of n-type source/drain regions.

The trench gate structure is formed in a main surface of the p-type semiconductor layer. The plurality of n-type drift layers are respectively formed in both sides of the trench gate structure in a surface layer portion of the main surface of the p-type semiconductor layer. The plurality of n-type source/drain regions are respectively formed in surface layer portions of the plurality of drift layers. A channel of the MOS transistor is formed in a region along a bottom portion of the trench gate structure.

CITATION LIST

Patent Literature

Patent Literature 1: United States Patent Application Publication No. 2007/0145474

SUMMARY OF INVENTION

Technical Problem

One preferred embodiment of the present invention provides a semiconductor device that can improve an electric current capacity in a structure including a common source/drain type MISFET.

Solution to Problem

One preferred embodiment of the present invention provides a semiconductor device including a semiconductor chip having a main surface, a first conductivity type drift layer formed in a surface layer portion of the main surface, a trench gate structure formed in the main surface such as to be in contact with the drift layer, a second conductivity type channel region formed in the drift layer such as to cover a side wall of the trench gate structure, and first and second source/drain regions formed at intervals in a region along the side wall of the trench gate structure in the drift layer such as to oppose each other across the channel region.

With this semiconductor device, an electric current can flow along the side wall of the trench gate structure. Therefore, it is possible to increase a current path, which makes it possible to improve an electric current capacity.

The aforementioned and still other objects, features, and effects of the present invention will become more apparent from the following description of preferred embodiments given below with reference to the attached drawings.

DESCRIPTION OF EMBODIMENTS

Figure 1:
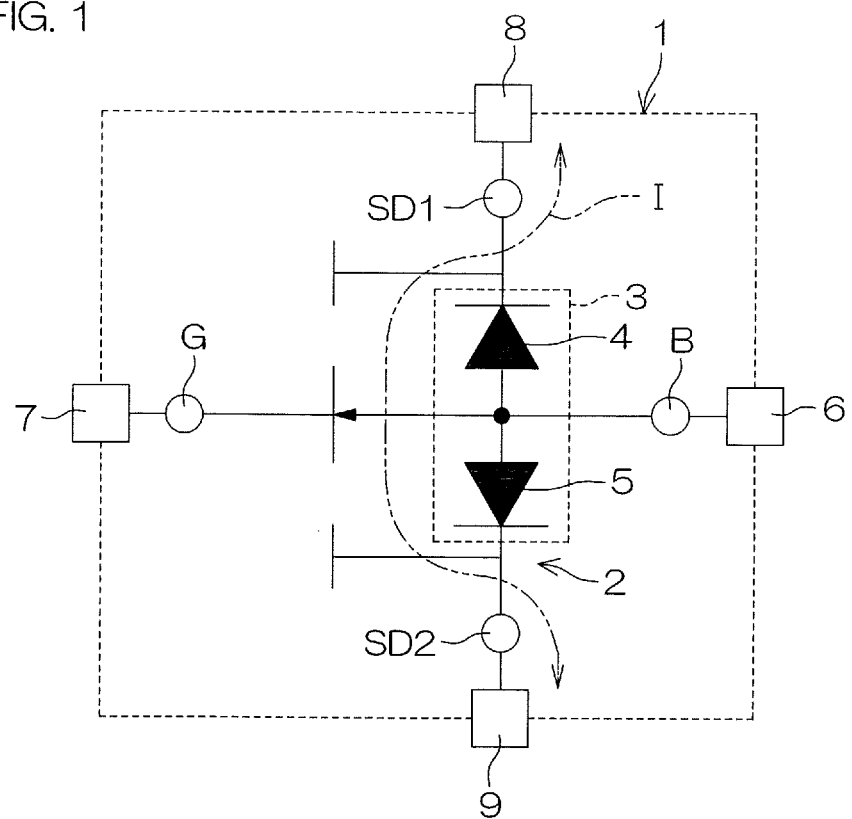
FIG. 1 is a circuit diagram showing a semiconductor device according to a first preferred embodiment of the present invention.

FIG. 1 is a circuit diagram showing a semiconductor device 1 according to a first preferred embodiment of the present invention.

The semiconductor device 1 includes a common source/drain type MISFET (Metal Insulator Semiconductor Field Effect Transistor) 2. The MISFET 2 includes a base B, a gate G, a first source/drain SD1, and a second source/drain SD2. Each of the first source/drain SD1 and the second source/drain SD2 serves as both a source and a drain.

A Reference voltage (for example, ground voltage) which serves as a reference of a circuit operation is to be applied to the base B. A gate voltage VG taking the base B as a reference is to be applied to the gate G. The gate G controls conduction and interruption of an electric current I flowing between the first source/drain SD1 and the second source/drain SD2. A first source/drain voltage VSD1 (first voltage) is to be applied to the first source/drain SD1. A second source/drain voltage VSD2 (second voltage) which is different from the first source/drain voltage VSD1 is to be applied to the second source/drain SD2.

The semiconductor device 1 further includes a diode pair 3 connected to the first source/drain SD1 and the second source/drain SD2. The diode pair 3 restricts (interrupts) the electric current I flowing between the first source/drain SD1 and the second source/drain SD2 in a state where the MISFET 2 is in an off state.

Specifically, the diode pair 3 includes a first body diode 4 and a second body diode 5 which are connected to each other in a reverse-biased manner. Each of the first body diode 4 and the second body diode 5 includes an anode and a cathode.

The anode of the first body diode 4 is connected to the base B. The cathode of the first body diode 4 is connected to the first source/drain SD1. The anode of the second body diode 5 is connected to the base B. The cathode of the second body diode 5 is connected to the second source/drain SD2.

The semiconductor device 1 is a four-terminal device including four external terminals 6, 7, 8, and 9. Specifically, the external terminals 6 to 9 include a base terminal 6, a gate terminal 7, a first source/drain terminal 8, and a second source/drain terminal 9. The base terminal 6 is connected to the base B. The gate terminal 7 is connected to the gate G. The first source/drain terminal 8 is connected to the first source/drain SD1. The second source/drain terminal 9 is connected to the second source/drain SD2.

The MISFET 2 is a bidirectional device that enables the electric current I to flow in both directions of the first source/drain terminal 8 and the second source/drain terminal 9. That is, in a case in which the first source/drain terminal 8 is connected to the high voltage side (input side), the second source/drain terminal 9 is connected to the low voltage side (output side). Meanwhile, in a case in which the first source/drain terminal 8 is connected to the low voltage side (output side), the second source/drain terminal 9 is connected to the high voltage side (input side).

In a case in which the gate voltage VG which is not less than a gate threshold voltage Vth (Vth≤VG) is applied to the gate terminal 7, the electric current I flows between the first source/drain terminal 8 and the second source/drain terminal 9. In a case in which the gate voltage VG less than the gate threshold voltage Vth (VG<Vth) is applied to the gate terminal 7, no electric current I flows between the first source/drain terminal 8 and the second source/drain terminal 9. In this way, on and off of the MISFET 2 are controlled.

With the semiconductor device 1, the single MISFET 2 can realize the function of a circuit in which drains of two non-common source/drain type MISFETs are connected to each other. Therefore, with the semiconductor device 1, it is possible to achieve low on-resistance by shortening a current path. Hereinafter, a specific structure of the semiconductor device 1 will be described.

Figure 2:
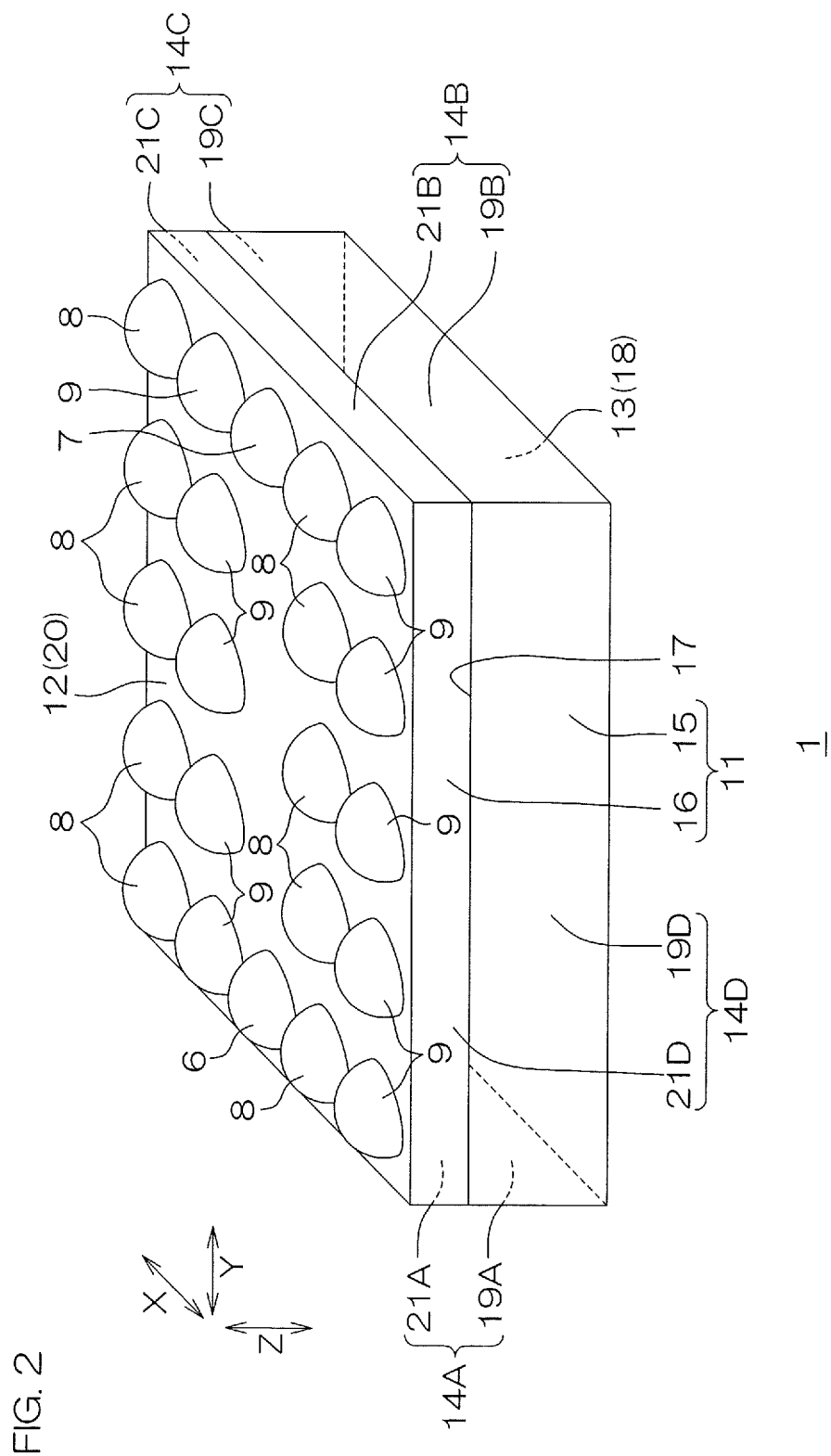
FIG. 2 is a perspective view of the semiconductor device shown in FIG. 1.
Figure 3:
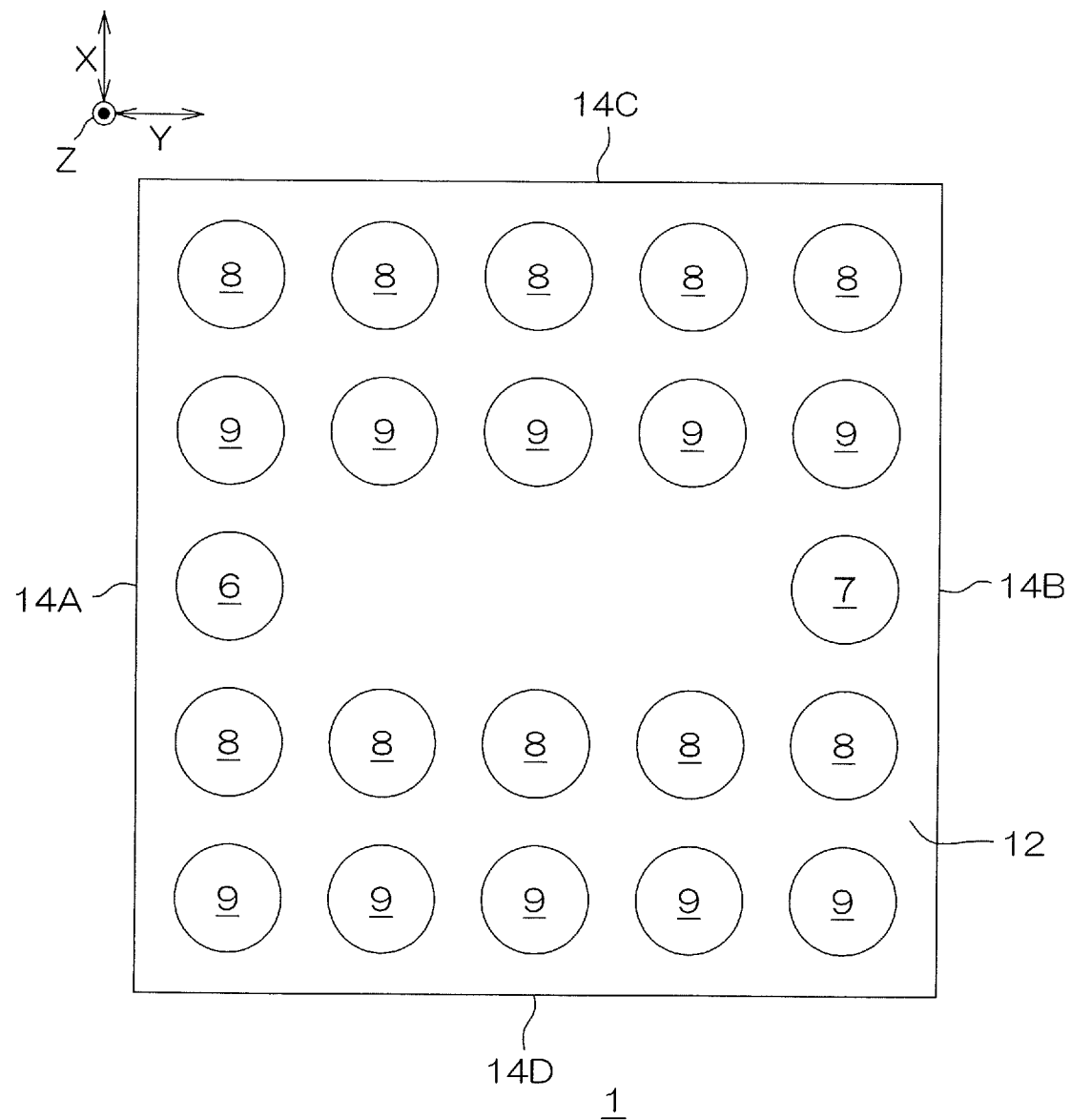
FIG. 3 is a plan view of the semiconductor device shown in FIG. 2.

FIG. 2 is a perspective view of the semiconductor device 1 shown in FIG. 1. FIG. 3 is a plan view of the semiconductor device 1 shown in FIG. 2. Hereinafter, an example in which the semiconductor device 1 includes a chip size package having the size of a chip as a package size will be described.

With reference to FIGS. 2 and 3, the semiconductor device 1 includes a rectangular-parallelepiped-shaped device main body 11. The device main body 11 includes a first device surface 12 on one side, a second device surface 13 on the other side, and device side surfaces 14A, 14B, 14C, and 14D connecting the first device surface 12 and the second device surface 13. Specifically, the device side surfaces 14A to 14D include a first device side surface 14A, a second device side surface 14B, a third device side surface 14C, and a fourth device side surface 14D.

Each of the first device surface 12 and the second device surface 13 is formed in a quadrangular shape in a plan view seen from their normal direction Z (hereinafter, referred to simply as "in a plan view"). The first device surface 12 is a connection surface (mounting surface) opposing an object to be connected when connected to the object to be connected. The second device surface 13 is a non-connection surface (non-mounting surface) on the side opposite to the connection surface. Amount board, an electronic component, a lead frame of a semiconductor package, etc., may be included in the object to be connected.

In a plan view, the first device side surface 14A and the second device side surface 14B extend in a first direction X and oppose each other in a second direction Y intersecting the first direction X. In a plan view, the third device side surface 14C and the fourth device side surface 14D extend in the second direction Y and oppose each other in the first direction X. Specifically, the second direction Y is orthogonal to the first direction X.

Each of the device side surfaces 14A to 14D planarly extends along the normal direction Z. Each of the device side surfaces 14A to 14D may be a ground surface having a grinding mark. The length of the first device side surface 14A (second device side surface 14B) may be not less than 1 mm and 5 mm. The length of the third device side surface 14C (fourth device side surface 14D) may be not less than 1 mm and not more than 5 mm.

The device main body 11 has a laminated structure including a semiconductor chip 15 and an insulation layer 16. The semiconductor chip 15 forms the second device surface 13 and a part of the device side surfaces 14A to 14D. The insulation layer 16 forms the first device surface 12 and a part of the device side surfaces 14A to 14D.

In this embodiment, the semiconductor chip 15 is made of silicon. The semiconductor chip 15 is formed in a rectangular-parallelepiped shape. The semiconductor chip 15 includes a first main surface 17 on one side, a second main surface 18 on the other side, and side surfaces 19A, 19B, 19C, and 19D connecting the first main surface 17 and the second main surface 18. Specifically, the side surfaces 19A to 19D include a first side surface 19A, a second side surface 19B, a third side surface 19C, and a fourth side surface 19D.

The first main surface 17 and the second main surface 18 are formed in a quadrangular shape in a plan view. The first main surface 17 may be a ground surface. The second main surface 18 may be a ground surface. The second main surface 18 forms the second device surface 13. The side surfaces 19A to 19D form a part of the device side surfaces 14A to 14D.

The insulation layer 16 is formed on the first main surface 17. The insulation layer 16 includes an insulation main surface 20 and insulation side surfaces 21A, 21B, 21C, and 21D. Specifically, the insulation side surfaces 21A to 21D include a first insulation side surface 21A, a second insulation side surface 21B, a third insulation side surface 21C, and a fourth insulation side surface 21D.

The insulation main surface 20 extends parallel to the first main surface 17, and is formed in a quadrangular shape in a plan view. The insulation main surface 20 forms the first device surface 12. The insulation side surfaces 21A to 21D form a part of the device side surfaces 14A to 14D. The insulation side surfaces 21A to 21D extend from a peripheral edge of the insulation main surface 20 to the semiconductor chip 15, and continue to the side surfaces 19A to 19D. Specifically, the insulation side surfaces 21A to 21D are formed such as to be flush with the side surfaces 19A to 19D.

The plurality of external terminals 6 to 9 are formed on the insulation main surface 20. In this embodiment, the plurality of external terminals 6 to 9 are arrayed in a matrix with five rows and five columns at intervals in the first direction X and the second direction Y. In this embodiment, the plurality of external terminals 6 to 9 include the single base terminal 6, the single gate terminal 7, a plurality of the first source/drain terminals 8, and a plurality of the second source/drain terminals 9.

The base terminal 6 is arranged in the first column of the third row. The gate terminal 7 is arranged in the fifth column of the third row. The gate terminal 7 opposes the base terminal 6 in the second direction Y. The plurality of first source/drain terminals 8 are arranged in the first to fifth columns of the first row and in the first to fifth columns of the fourth row. The plurality of second source/drain terminals 9 are arranged in the first to fifth columns of the second row and in the first to fifth columns of the fifth row.

The plurality of second source/drain terminals 9 arranged in the second row oppose the plurality of first source/drain terminals 8 arranged in the first row in one-to-one correspondence in the first direction X. The plurality of second source/drain terminals 9 arranged in the fifth row oppose the plurality of first source/drain terminals 8 arranged in the fourth row in one-to-one correspondence in the first direction X.

In this embodiment, spaces are respectively provided in the second, third, and fourth columns of the third row. Any one of the base terminal 6, the gate terminal 7, the first source/drain terminal 8, and the second source/drain terminal 9 may be arranged in each of the spaces. An open terminal which is electrically open may be arranged in each of the spaces. Both the number and array of the base terminal 6, the gate terminal 7, the first source/drain terminal 8, and the second source/drain terminal 9 are arbitrary, and not limited to the number and array shown in FIGS. 2 and 3.

Figure 4:
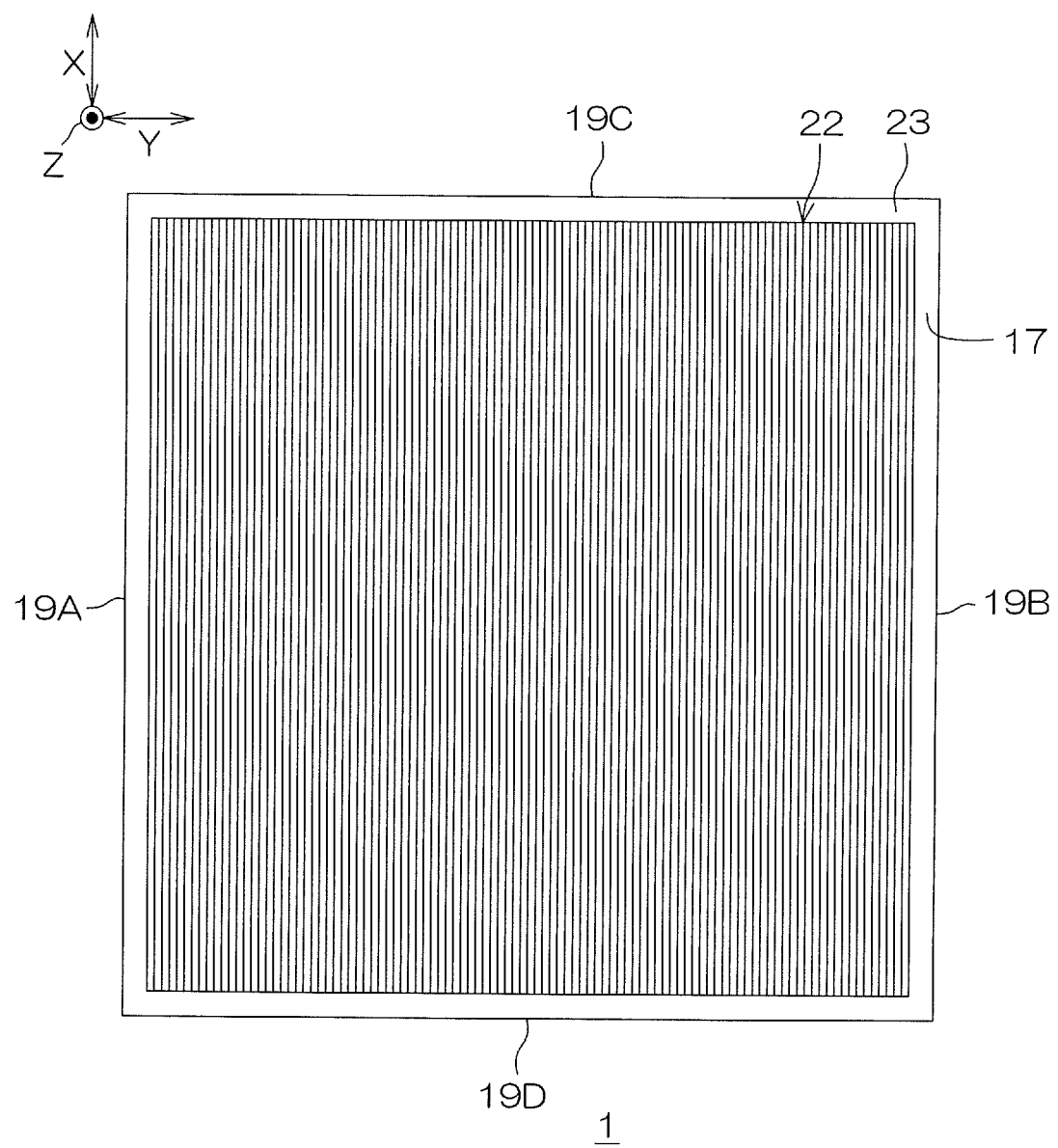
FIG. 4 is a plan view showing a structure of a semiconductor chip.
Figure 5:
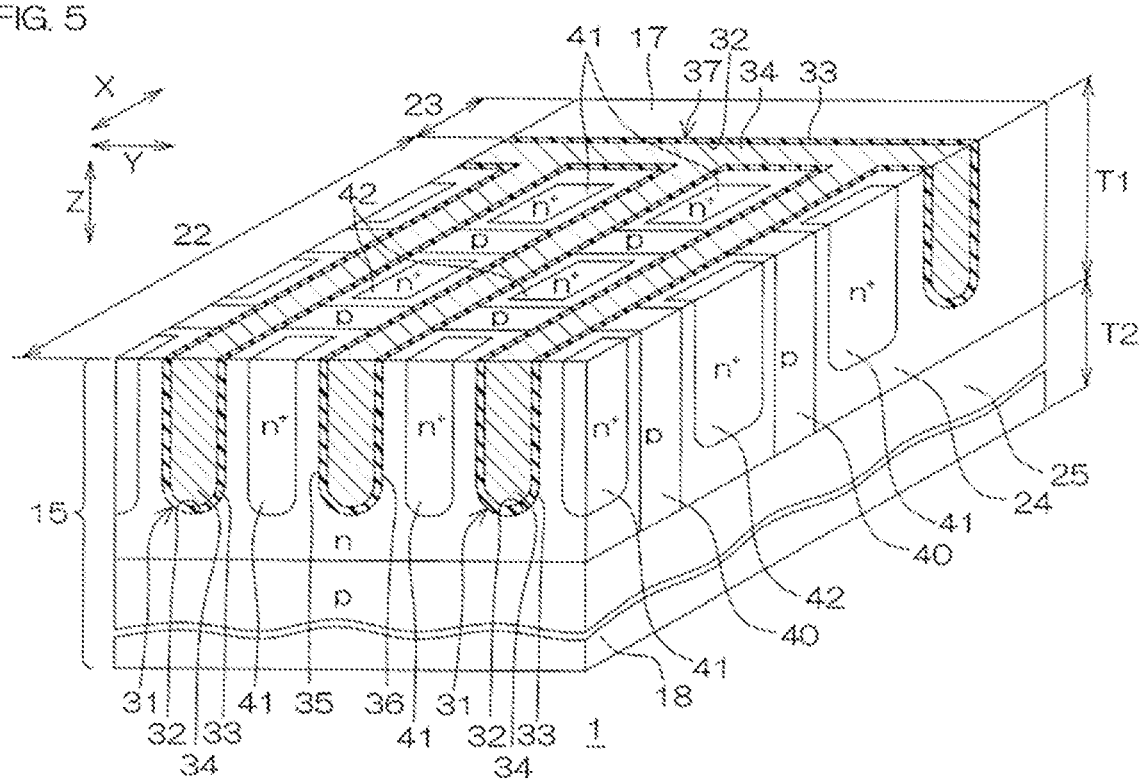
FIG. 5 is a perspective cross-sectional view of major portions showing the structure of the semiconductor chip.
Figure 6:
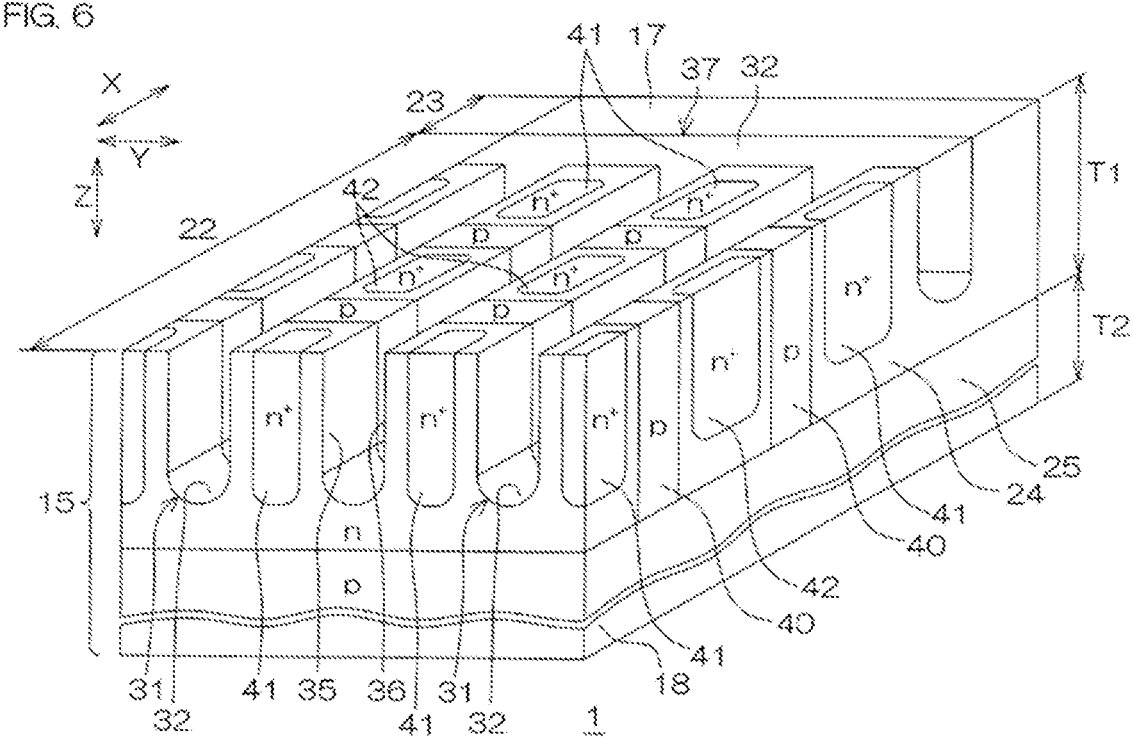
FIG. 6 is a perspective cross-sectional view of major portions excluding structures on the semiconductor chip from FIG. 5.
Figure 7:
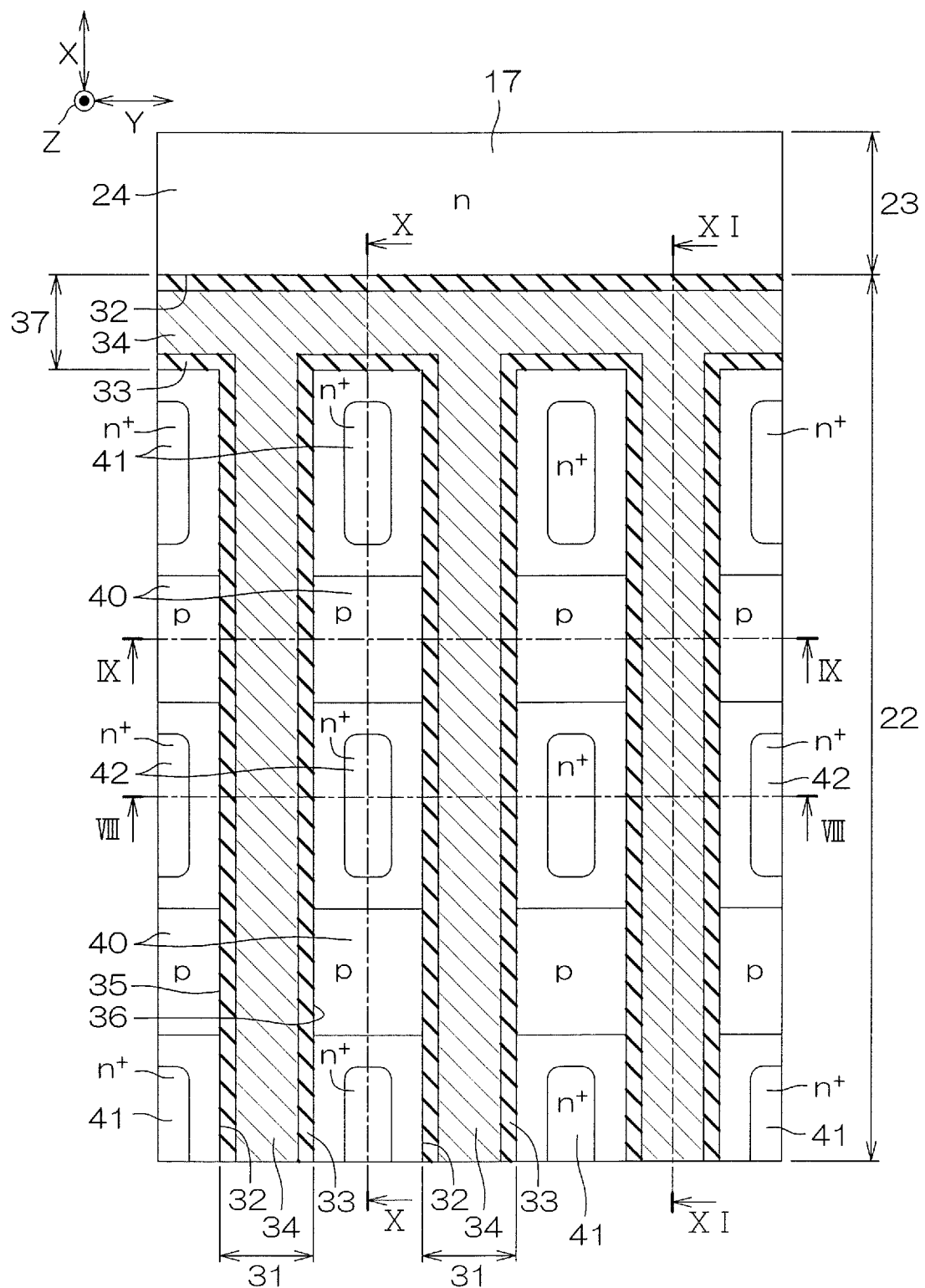
FIG. 7 is a plan view of the semiconductor chip shown in FIG. 5.
Figure 8:
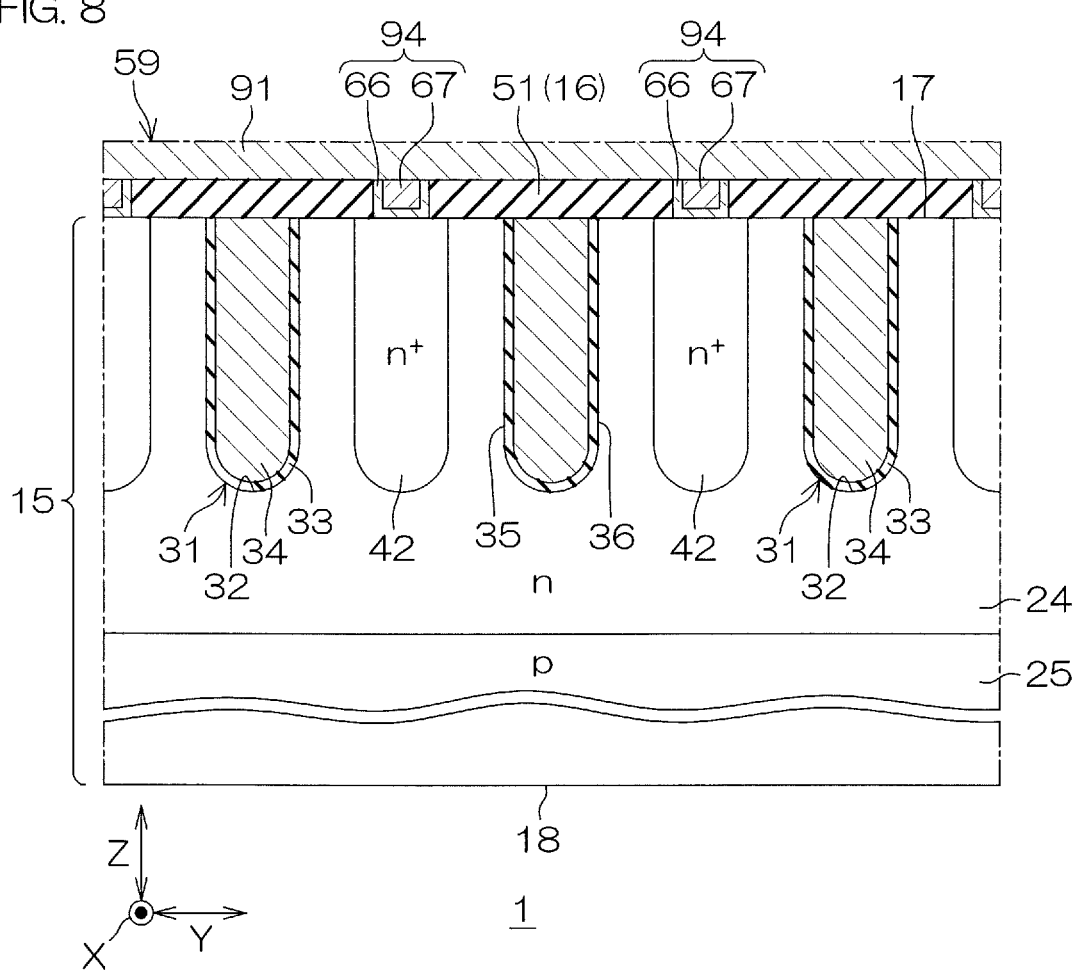
FIG. 8 is a cross-sectional view taken along line VIII-VIII shown in FIG. 7.
Figure 9:
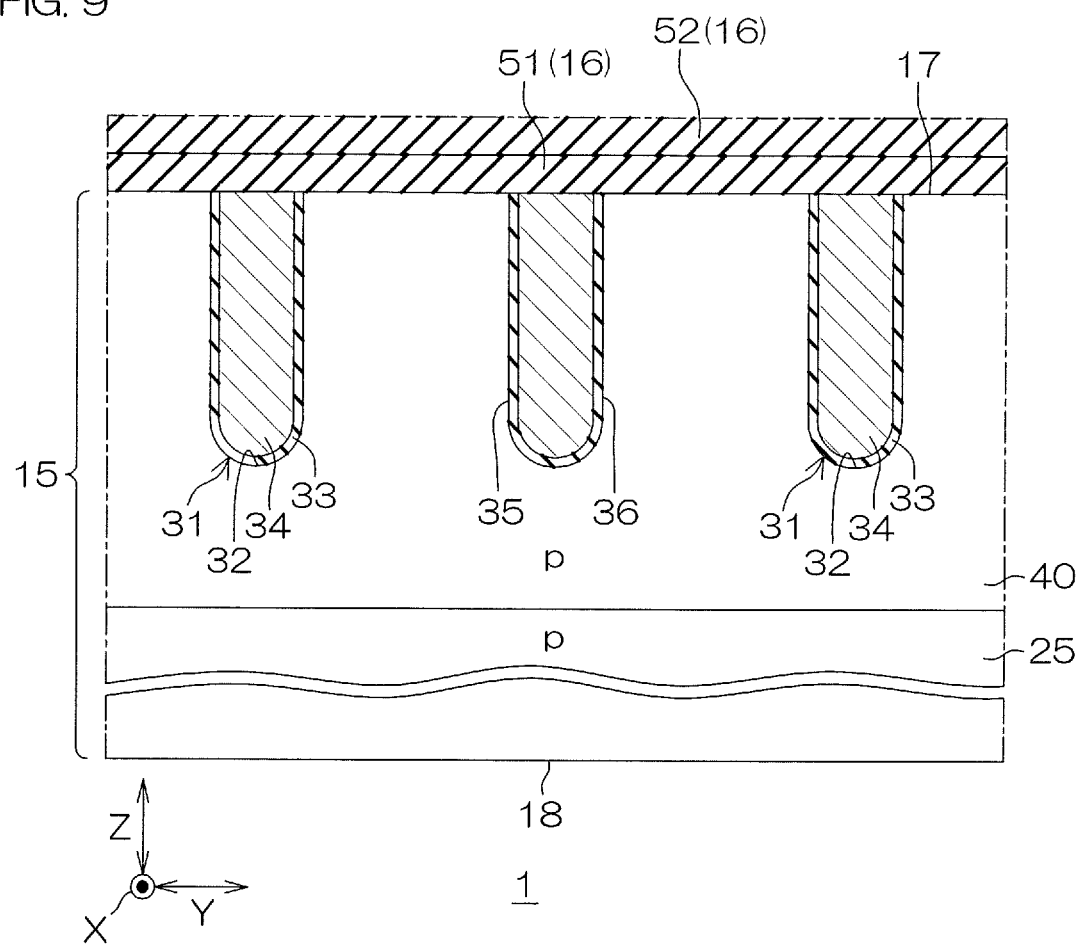
FIG. 9 is a cross-sectional view taken along line IX-IX shown in FIG. 7.
Figure 10:
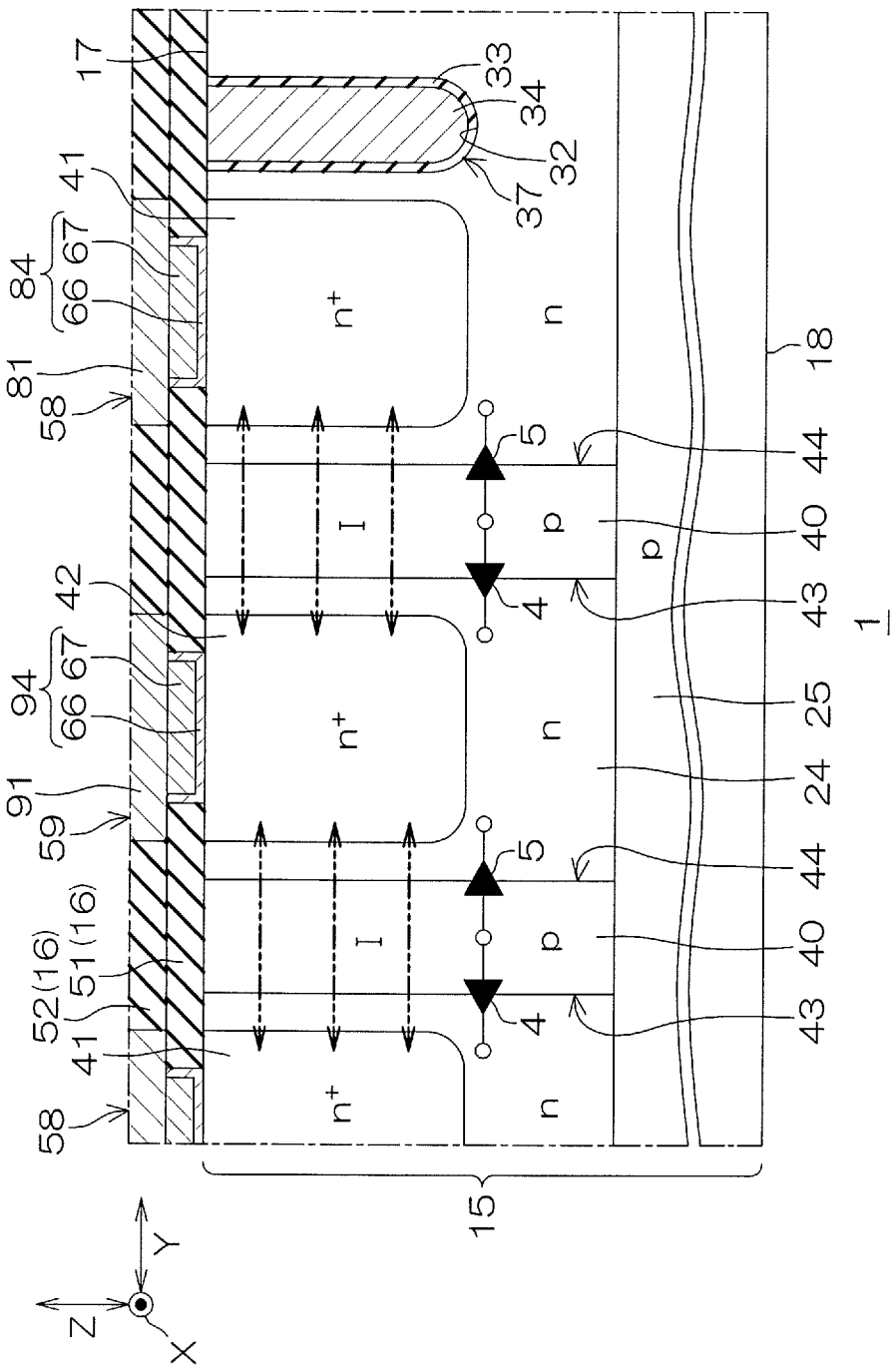
FIG. 10 is a cross-sectional view taken along line X-X shown in FIG. 7.
Figure 11:
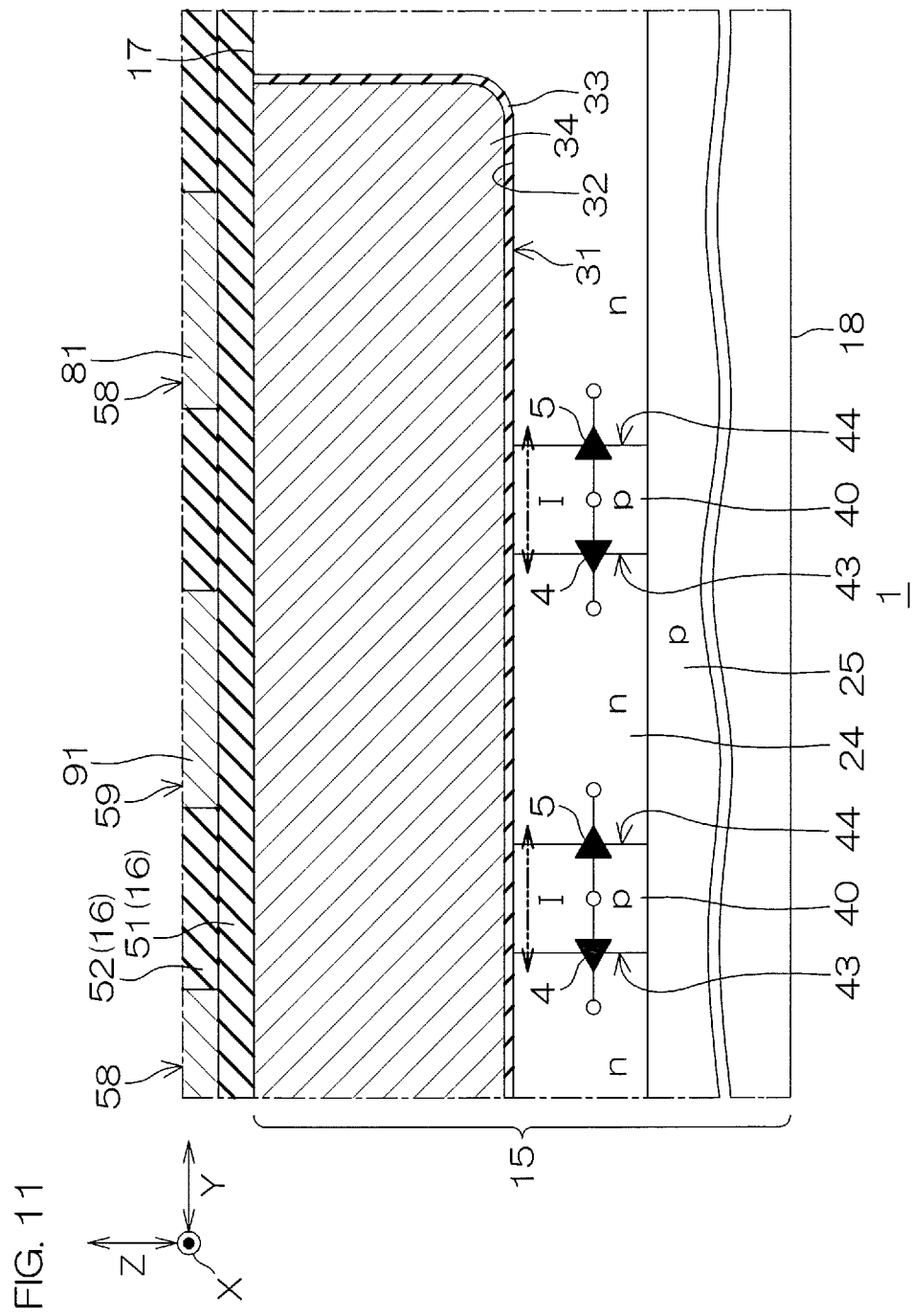
FIG. 11 is a cross-sectional view taken along line XI-XI shown in FIG. 7.

FIG. 4 is a plan view showing a structure of the semiconductor chip 15. FIG. 5 is a perspective cross-sectional view of major portions showing the structure of the semiconductor chip 15. FIG. 6 is a perspective cross-sectional view of major portions excluding structures on the semiconductor chip 15 from FIG. 5. FIG. 7 is a plan view of the semiconductor chip 15 shown in FIG. 5. FIG. 8 is a cross-sectional view taken along line VIII-VIII shown in FIG. 7. FIG. 9 is a cross-sectional view taken along line IX-IX shown in FIG. 7. FIG. 10 is a cross-sectional view taken along line X-X shown in FIG. 7. FIG. 11 is a cross-sectional view taken along line XI-XI shown in FIG. 7.

With reference to FIG. 4, the semiconductor chip 15 includes a device region 22 and an outside region 23. The device region 22 is also referred to as an active region. The device region 22 is a region where the MISFET 2 is formed. The device region 22 is formed at intervals inward from the side surfaces 19A to 19D in a plan view.

In this embodiment, the device region 22 is formed in a quadrangular shape having four sides which are parallel to the side surfaces 19A to 19D in a plan view. The planar shape of the device region 22 is arbitrary, and not limited to a quadrangular shape. The outside region 23 is a region on the outside of the device region 22. The outside region 23 extends in a band shape along a peripheral edge of the device region 22 in a plan view. Specifically, the outside region 23 is formed in an endless shape (quadrangular-annular shape in this embodiment) surrounding the device region 22 in a plan view.

With reference to FIGS. 5 to 11, the semiconductor device 1 includes an n-type (first conductivity type) drift layer 24 formed in a surface layer portion of the first main surface 17 of the semiconductor chip 15. The drift layer 24 is formed over the entire region of the surface layer portion of the first main surface 17. The drift layer 24 forms the first main surface 17 and a part of the side surfaces 19A to 19D. An n-type impurity concentration of the drift layer 24 may be not less than $1 \times 10^{14}$ cm$^{-3}$ and not more than $1 \times 10^{16}$ cm$^{-3}$.

The drift layer 24 has a first thickness T1. The first thickness T1 may be not less than 5 μm and not more than 50 μm. The first thickness T1 may be not less than 5 μm and not more than 10 μm, not less than 10 μm and not more than 20 μm, not less than 20 μm and not more than 30 μm, not less than 30 μm and not more than 40 μm, or not less than 40 μm and not more than 50 μm. In this embodiment, the drift layer 24 is constituted of an n-type epitaxial layer.

The semiconductor device 1 includes a p-type (second conductivity type) base layer 25 formed in a region on the side of the second main surface 18 of the semiconductor chip 15 with respect to the drift layer 24. The base layer 25 forms the base B of the MISFET 2 (see FIG. 1). The base layer 25 is formed over the entire region on the side of the second main surface 18 of the semiconductor chip 15, and electrically connected to the drift layer 24. The base layer 25 forms the second main surface 18 and a part of the side surfaces 19A to 19D. A p-type impurity concentration of the base layer 25 may be not less than $1 \times 10^{18}$ cm$^{-3}$ and not more than $1 \times 10^{21}$ cm$^{-3}$.

The base layer 25 has a second thickness T2 which is not less than the first thickness T1 of the drift layer 24 (T1≤T2). The second thickness T2 may be not less than 50 μm and not more than 500 μm. The second thickness T2 may be not less than 50 μm and not more than 100 μm, not less than 100 μm and not more than 200 μm, not less than 200 μm and not more than 300 μm, not less than 300 μm and not more than 400 μm, or not less than 400 μm and not more than 500 μm. The second thickness T2 preferably exceeds the first thickness T1 (T1<T2). In this embodiment, the base layer 25 is constituted of a p-type semiconductor substrate.

The semiconductor device 1 includes at least one trench gate structure 31 (in this embodiment, a plurality of trench gate structures 31) formed in the first main surface 17 in the device region 22. The plurality of trench gate structures 31 are respectively formed in a band shape extending in the first direction X and are formed at intervals in the second direction Y in a plan view. The plurality of trench gate structures 31 are formed in a stripe shape extending in the first direction X in a plan view. Each of the trench gate structures 31 is in contact with the drift layer 24. Each of the trench gate structures 31 is formed at an interval from a bottom portion of the drift layer 24 to the first main surface 17 side, and opposes the base layer 25 across a part of the drift layer 24.

The plurality of trench gate structures 31 are formed at a predetermined pitch PT. The pitch PT is a distance between the two adjacent trench gate structures 31. The pitch PT may be not less than 0.5 μm and not more than 5 μm. The pitch PT may be not less than 0.5 μm and not more than 1 μm, not less than 1 μm and not more than 1.5 μm, not less than 1.5 μm and not more than 2 μm, not less than 2 μm and not more than 2.5 μm, not less than 2.5 μm and not more than 3 μm, not less than 3 μm and not more than 4 μm, or not less than 4 μm and not more than 5 μm.

Each of the plurality of trench gate structures 31 includes a gate trench 32, a gate insulation layer 33, and a gate electrode 34. The gate trench 32 is dug down from the first main surface 17 to the second main surface 18. The gate trench 32 has a side wall 35 and a bottom wall 36. Hereinafter, the side wall 35 and the bottom wall 36 will be sometimes collectively referred to as the "inner wall." The side wall 35 and the bottom wall 36 are placed in the drift layer 24.

The side wall 35 extends along the normal direction Z. An absolute value of an angle made by the side wall 35 and the first main surface 17 in the semiconductor chip 15 may be not less than 90° and not more than 95° (for example, about 91°). The gate trench 32 may be formed in a tapered shape in which an opening width is gradually narrowed down toward the bottom wall 36 side. The side wall 35 may be formed perpendicularly to the first main surface 17. The bottom wall 36 is formed in a curved shape toward the second main surface 18. The bottom wall 36 may be formed in parallel to the first main surface 17.

The gate trench 32 may have a depth D of not less than 0.1 µm and not more than 20 µm. The depth D may be not less than 0.1 µm and not more than 1 µm, not less than 1 µm and not more than 2 µm, not less than 2 µm and not more than 4 µm, not less than 4 µm and not more than 6 µm, not less than 6 µm and not more than 8 µm, not less than 8 µm and not more than 10 µm, not less than 10 µm and not more than 15 µm, or not less than 15 µm and not more than 20 µm.

The gate trench 32 may have an opening width W of not less than 0.1 µm and not more than 3 µm. The opening width W may be not less than 0.1 µm and not more than 0.5 µm, not less than 0.5 µm and not more than 1 µm, not less than 1 µm and not more than 1.5 µm, not less than 1.5 µm and not more than 2 µm, not less than 2 µm and not more than 2.5 µm, or not less than 2.5 µm and not more than 3 µm.

The opening width W is preferably not more than the depth D. An aspect ratio D/W of the gate trench 32 may be not less than 1 and not more than 20. The aspect ratio D/W is a ratio of the depth D with respect to the opening width W. The aspect ratio D/W may be not less than 1 and not more than 2, not less than 2 and not more than 4, not less than 4 and not more than 6, not less than 6 and not more than 8, not less than 8 and not more than 10, not less than 10 and not more than 12, not less than 12 and not more than 14, not less than 14 and not more than 16, not less than 16 and not more than 18, or not less than 18 and not more than 20.

The gate insulation layer 33 is formed in a film shape on the inner wall of the gate trench 32. The gate insulation layer 33 contains at least one of silicon oxide, silicon nitride, aluminum oxide, zirconium oxide, and tantalum oxide. The gate insulation layer 33 is preferably made of silicon oxide.

The gate insulation layer 33 is formed over the entire region of the inner wall of the gate trench 32, and partitions a recess space in the gate trench 32. The gate insulation layer 33 includes an exposed portion exposed from the first main surface 17. The exposed portion of the gate insulation layer 33 may be formed such as to be flush with the first main surface 17. The exposed portion of the gate insulation layer 33 may be a ground surface.

With respect to the normal direction of the inner wall of the gate trench 32, the thickness of the gate insulation layer 33 may be not less than 10 nm and not more than 300 nm. The thickness of the gate insulation layer 33 may be not less than 10 nm and not more than 25 nm, not less than 25 nm and not more than 50 nm, not less than 50 nm and not more than 75 nm, not less than 75 nm and not more than 100 nm, not less than 100 nm and not more than 150 nm, not less than 150 nm and not more than 200 nm, not less than 200 nm and not more than 250 nm, or not less than 250 nm and not more than 300 nm.

The gate electrode 34 is embedded in the gate trench 32 across the gate insulation layer 33. Specifically, the gate electrode 34 is embedded in the recess space partitioned by the gate insulation layer 33 in the gate trench 32. The gate electrode 34 forms the gate G of the MISFET 2 (see FIG. 1).

The gate electrode 34 includes an exposed portion exposed from the first main surface 17. The exposed portion of the gate electrode 34 may be formed such as to be flush with the first main surface 17. The exposed portion of the gate electrode 34 may be a ground surface. The gate electrode 34 preferably contains conductive polysilicon. The conductive polysilicon may be p-type polysilicon or n-type polysilicon. The gate electrode 34 preferably contains n-type polysilicon. The gate electrode 34 may contain a metal material such as tungsten (W), copper (Cu), and aluminum (Al).

The semiconductor device 1 further includes at least one trench contact structure 37 formed in the first main surface 17 in a peripheral edge portion of the device region 22. In this embodiment, the semiconductor device 1 includes a plurality of (in this embodiment, two) trench contact structures 37. The trench contact structure 37 on one side extends in the direction intersecting (specifically, orthogonal to) the plurality of trench gate structures 31, and is connected to one end portions of the plurality of trench gate structures 31. The trench contact structure 37 on the other side extends in the direction intersecting (specifically, orthogonal to) the plurality of trench gate structures 31, and is connected to the other end portions of the plurality of trench gate structures 31.

Each of the plurality of trench contact structures 37 includes a gate trench 32, a gate insulation layer 33, and a gate electrode 34 like the trench gate structure 31. The gate trenches 32, the gate insulation layers 33, and the gate electrodes 34 of the trench contact structures 37 are respectively integrated with the gate trenches 32, the gate insulation layers 33, and the gate electrodes 34 of the trench gate structures 31.

That is, in this embodiment, with the plurality of trench contact structures 37, it can be regarded that a plurality of annular trench gate structures 31 having portions which extend in the first direction X and portions which extend in the second direction Y are formed. The plurality of annular trench gate structures 31 continue to each other such that the portions which extend in the first direction X are integrated. In this structure, it can be regarded that the plurality of trench contact structures 37 respectively form the portions which extend in the second direction Y of the annular trench gate structures 31. Thereby, a single ladder-shaped trench gate structure 31 is formed in a plan view.

The semiconductor device 1 includes at least one p-type channel region 40 (in this embodiment, a plurality of channel regions 40) formed in the drift layer 24 such as to cover the side walls 35 of the trench gate structures 31. Each of the channel regions 40 forms a channel CH of the MISFET 2 in a portion along the side wall 35 of the trench gate structure 31. A p-type impurity concentration of the channel regions 40 may be not less than $1 \times 10^{14}$ cm$^{-3}$ and not more than $1 \times 10^{18}$ cm$^{-3}$.

The plurality of channel regions 40 are formed at intervals in the first direction X and respectively formed in a band shape extending in the second direction Y in a plan view. The plurality of channel regions 40 are formed in a stripe shape extending in the second direction Y in a plan view. The plurality of channel regions 40 intersect (specifically, are orthogonal to) the plurality of trench gate structures 31. The plurality of channel regions 40 are respectively formed in a region between the two adjacent trench gate structures 31 at intervals in the first direction X.

Each of the channel regions 40 extends from the first main surface 17 to the bottom portion of the drift layer 24 and has a bottom portion placed on the side of the bottom portion of the drift layer 24 with respect to the bottom wall 36 of the trench gate structure 31. In this embodiment, each of the bottom portions of the channel regions 40 is connected to the base layer 25. Thereby, each of the channel regions 40 is electrically connected to the base layer 25. That is, the reference voltage is applied to the channel regions 40 via the base layer 25.

Each of the channel regions 40 further covers the bottom wall 36 of the trench gate structure 31. Each of the channel regions 40 forms the channel CH of the MISFET 2 in the portion along the bottom wall 36 of the trench gate structure 31. The channel length of the channel CH is increased according to an increase in an area of the side wall 35 of the trench gate structure 31. Therefore, forming the deep trench gate structure 31 is effective for increasing the channel length of the MISFET 2.

Each of the channel regions 40 is formed by introduction of p-type impurities to the drift layer 24. Each of the channel regions 40 may have a trench structure containing a trench formed in the drift layer 24 and p-type polysilicon embedded in the trench.

The semiconductor device 1 includes an $n^+$ type first source/drain region 41 and an $n^+$ type second source/drain region 42 formed in the drift layer 24. Each of the first source/drain region 41 and the second source/drain region 42 is formed by a region in which a source region and a drain region are integrated. The first source/drain region 41 forms the first source/drain SD1 of the MISFET 2 (see FIG. 1). The second source/drain region 42 forms the second source/drain SD2 of the MISFET 2 (see FIG. 1).

Each of the first source/drain region 41 and the second source/drain region 42 has an n-type impurity concentration exceeding the n-type impurity concentration of the drift layer 24. The n-type impurity concentration of the first source/drain region 41 may be not less than $1\times10^{18}$ cm$^{-3}$ and not more than $1\times10^{21}$ cm$^{-3}$. The n-type impurity concentration of the second source/drain region 42 may be not less than $1\times10^{18}$ cm$^{-3}$ and not more than $1\times10^{21}$ cm$^{-3}$. The n-type impurity concentration of the second source/drain region 42 is preferably equal to the n-type impurity concentration of the first source/drain region 41.

The first source/drain region 41 and the second source/drain region 42 are formed at intervals in a region along the side wall 35 of the trench gate structure 31 in the drift layer 24 such as to oppose each other across the channel region 40. In this embodiment, the plurality of first source/drain regions 41 and the plurality of second source/drain regions 42 are formed in the drift layer 24.

The plurality of first source/drain regions 41 are formed at intervals in the first direction X in the region between the two adjacent trench gate structures 31. The plurality of first source/drain regions 41 oppose each other across the trench gate structure 31 in the second direction Y. That is, the plurality of first source/drain regions 41 are formed at intervals in the second direction Y in such a manner that they are arranged alternately with the plurality of trench gate structures 31 with respect to the second direction Y. The plurality of first source/drain regions 41 are arrayed in a matrix at intervals in the first direction X and the second direction Y in a plan view.

Each of the first source/drain regions 41 is formed at interval from each of the channel regions 40, and opposes each of the channel regions 40 across a part of the drift layer 24. Each of the first source/drain regions 41 is formed at interval from each of the trench gate structures 31, and opposes each of the trench gate structures 31 across a part of the drift layer 24.

A bottom portion of each of the first source/drain regions 41 is formed in a region on the first main surface 17 side with respect to the bottom portion of the drift layer 24. The bottom portion of each of the first source/drain regions 41 may be formed at a depth position between the bottom portion of the drift layer 24 and the bottom wall 36 of the trench gate structure 31. The bottom portion of each of the first source/drain regions 41 may be formed at a depth position between the first main surface 17 and the bottom wall 36 of the trench gate structure 31. From the viewpoint of increasing the channel length of the channel CH, each of the first source/drain regions 41 is preferably formed with a thickness that crosses at least an intermediate portion of each of the trench gate structures 31.

The plurality of second source/drain regions 42 are formed at intervals in the first direction X in the region between the two adjacent trench gate structures 31. Specifically, the plurality of second source/drain regions 42 are formed at intervals in the first direction X alternately with the plurality of first source/drain regions 41 such as to sandwich one of the channel regions 40.

The plurality of second source/drain regions 42 oppose each other across the trench gate structure 31 in the second direction Y. That is, the plurality of second source/drain regions 42 are formed at intervals in the second direction Y in such a manner that they are arranged alternately with the plurality of trench gate structures 31. Thereby, the plurality of second source/drain regions 42 are arrayed in a matrix at intervals in the first direction X and the second direction Y in a plan view.

Each of the second source/drain regions 42 is formed at intervals from each of the channel regions 40, and opposes each of the channel regions 40 across a part of the drift layer 24. Each of the second source/drain regions 42 is formed at intervals from each of the trench gate structures 31, and opposes each of the trench gate structures 31 across a part of the drift layer 24.

A bottom portion of each of the second source/drain regions 42 is formed in the region on the first main surface 17 side with respect to the bottom portion of the drift layer 24. The bottom portion of each of the second source/drain regions 42 may be formed at a depth position between the bottom portion of the drift layer 24 and the bottom wall 36 of the trench gate structure 31. The bottom portion of each of the second source/drain regions 42 may be formed at a depth position between the first main surface 17 and the bottom wall 36 of the trench gate structure 31.

From the viewpoint of increasing the channel length of the channel CH, each of the second source/drain regions 42 is preferably formed with a thickness that crosses at least the intermediate portion of each of the trench gate structures 31. Each of the second source/drain regions 42 is preferably formed with a thickness equal to the thickness of each of the first source/drain regions 41.

The semiconductor device 1 includes a first pn-junction portion 43. The first pn-junction portion 43 forms the first body diode 4 of the MISFET 2. The first pn-junction portion 43 is formed in a region between the channel region 40 and the first source/drain region 41. The first pn-junction portion 43 may be a first pin junction portion (p-intrinsic-n junction portion) having the channel region 40 as a P layer, the drift layer 24 as an I layer (Intrinsic layer), and the first source/drain region 41 as an N layer.

The semiconductor device 1 includes a second pn-junction portion 44. The second pn-junction portion 44 forms the second body diode 5 of the MISFET 2. That is, the second pn-junction portion 44 forms the diode pair 3 together with the first pn-junction portion 43. The second pn-junction portion 44 is formed in a region between the channel region 40 and the second source/drain region 42. The second pn-junction portion 44 is connected in a reverse-biased manner to the first pn-junction portion 43 via the channel region 40. The second pn-junction portion 44 may be a second pin junction portion having the channel region 40 as a P layer, the drift layer 24 as an I layer, and the second source/drain region 42 as an N layer.

In the semiconductor device 1, it can be regarded that the channel regions 40, the plurality of first source/drain regions 41, and the plurality of second source/drain regions 42 are respectively formed in a region partitioned by the annular trench gate structure 31. With this structure, it is possible to form the channel CH of the MISFET 2 in the region partitioned by the annular trench gate structure 31. Therefore, it is possible to restrict a current path of the MISFET 2 to the region partitioned by the annular trench gate structure 31, which makes it possible to suppress a leakage current.

Figure 12:
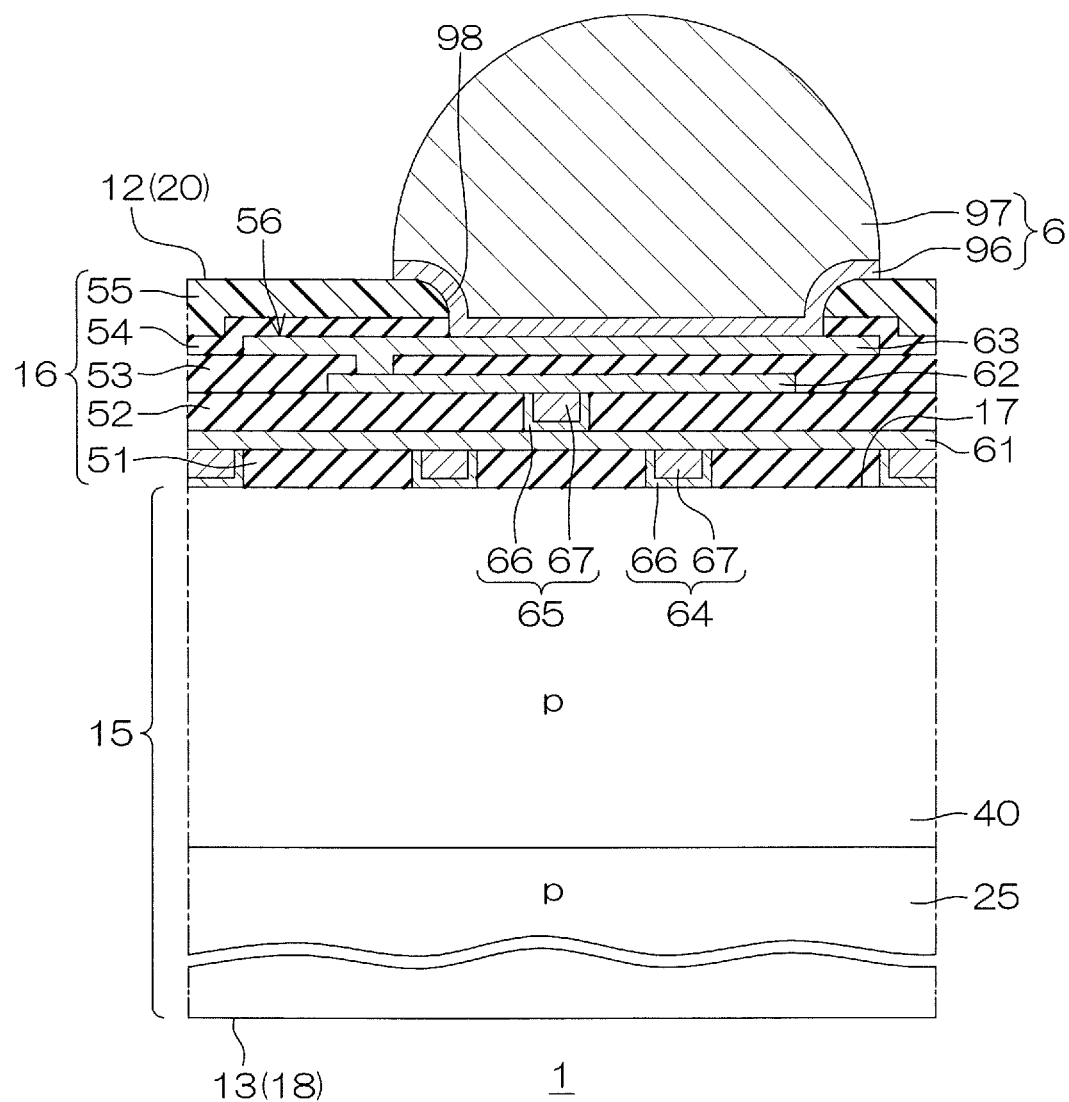
FIG. 12 is a schematic cross-sectional view showing a structure of a base wiring.
Figure 13:
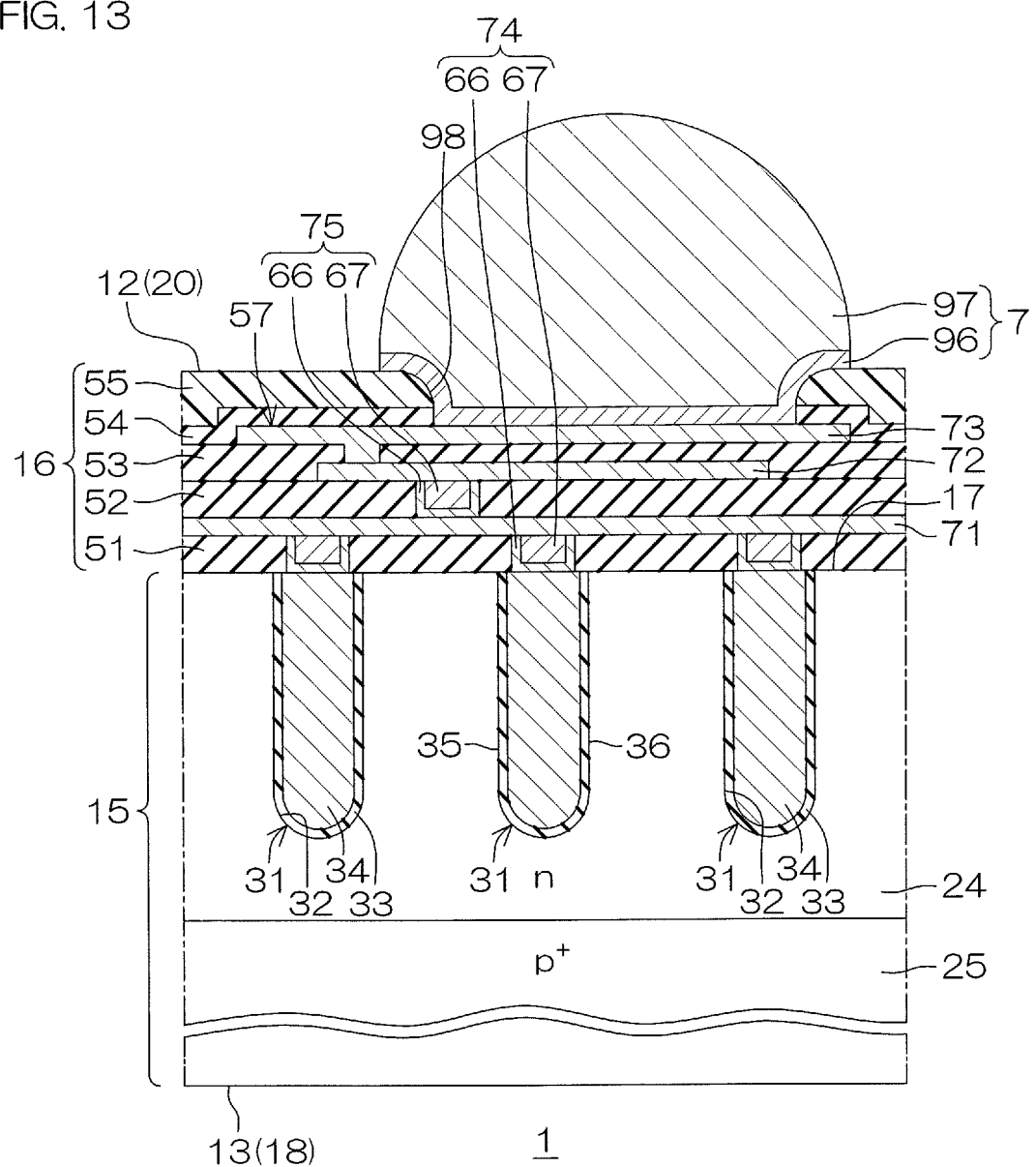
FIG. 13 is a schematic cross-sectional view showing a structure of a gate wiring.
Figure 14:
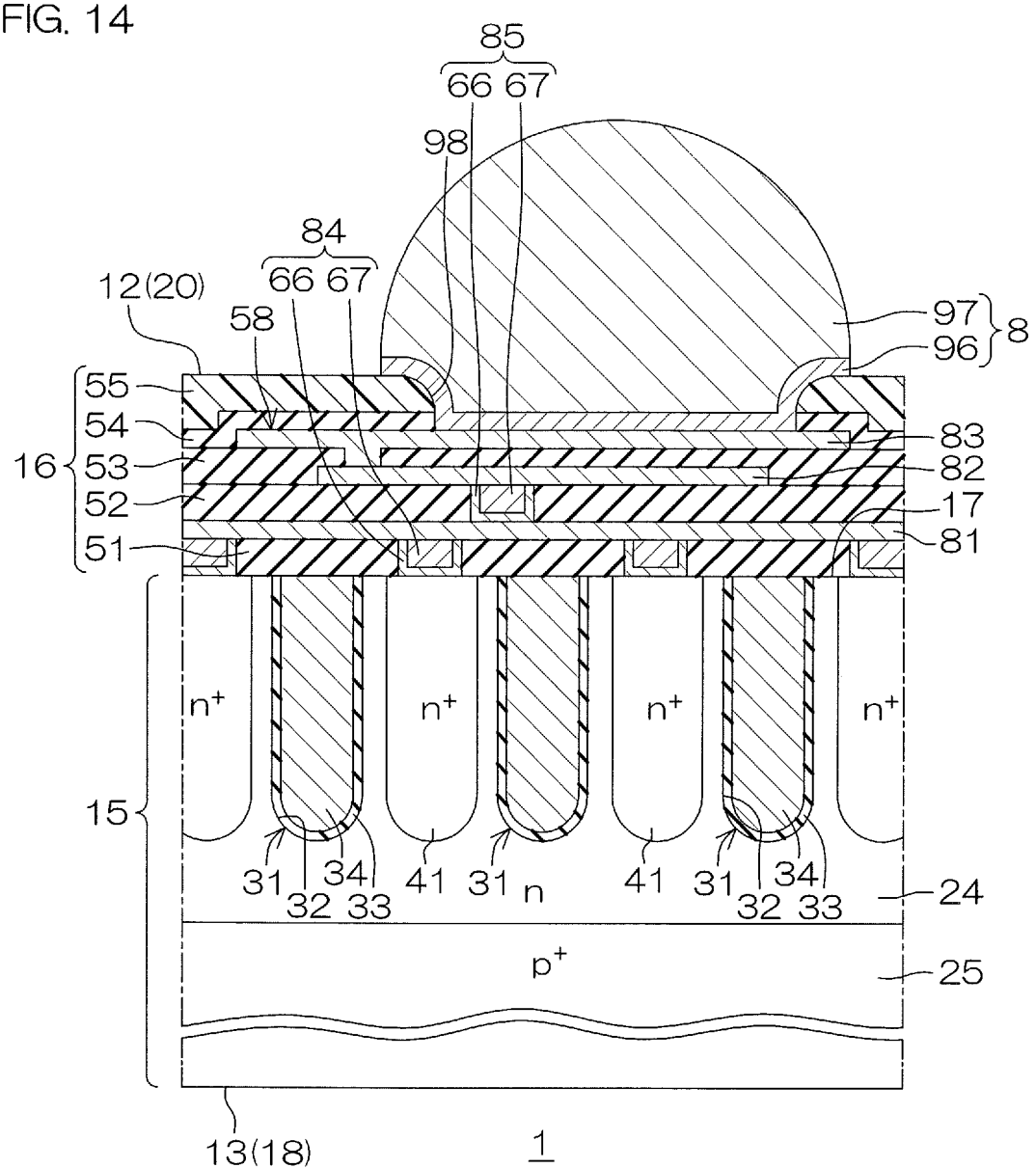
FIG. 14 is a schematic cross-sectional view showing a structure of a first source/drain wiring.
Figure 15:
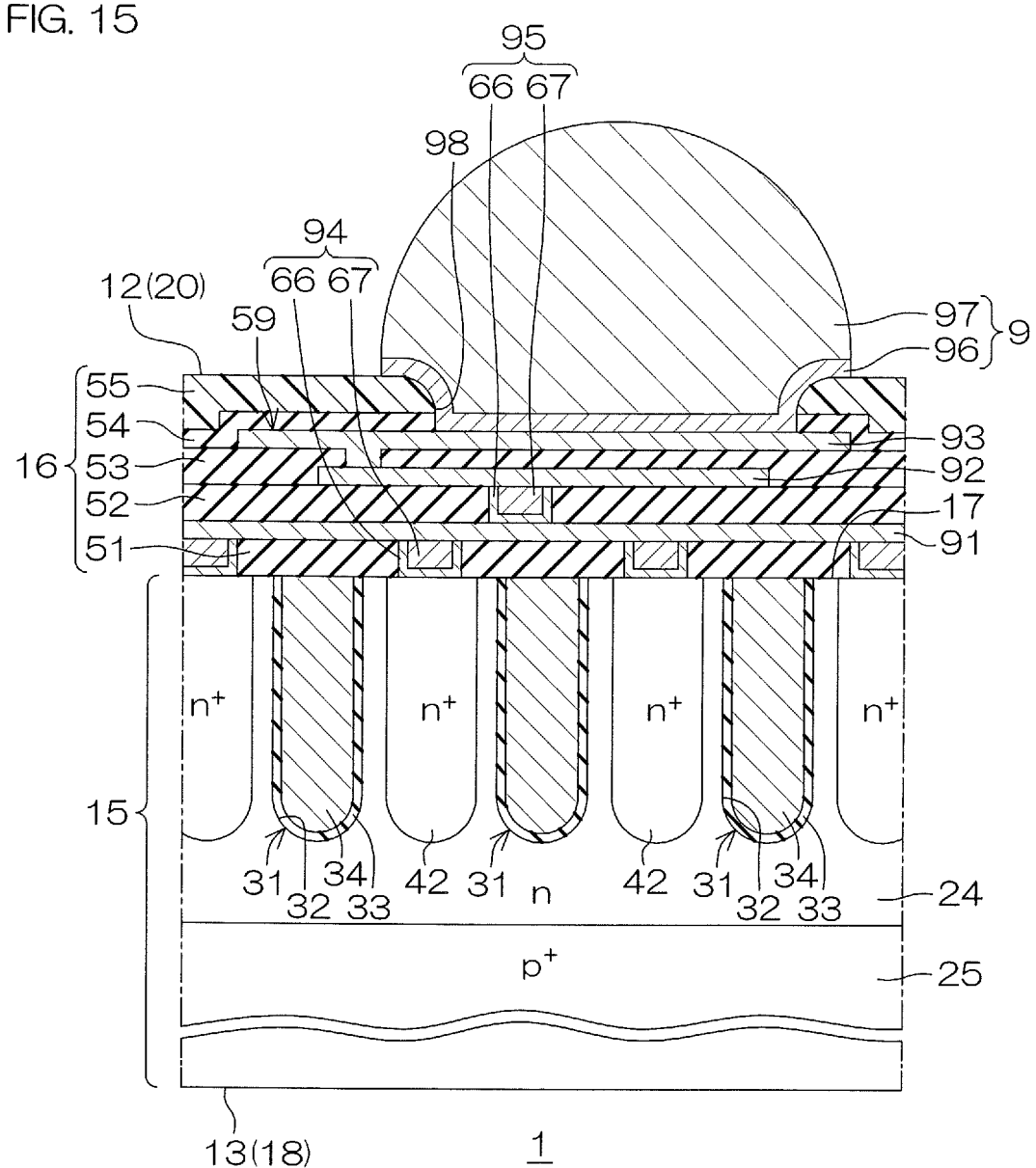
FIG. 15 is a schematic cross-sectional view showing a structure of a second source/drain wiring.

FIG. 12 is a schematic cross-sectional view showing a structure of a base wiring 56. FIG. 13 is a schematic cross-sectional view showing a structure of a gate wiring 57. FIG. 14 is a schematic cross-sectional view showing a structure of a first source/drain wiring 58. FIG. 15 is a schematic cross-sectional view showing a structure of a second source/drain wiring 59. FIGS. 12 to 15 do not indicate a section of a specific point in the semiconductor device 1.

With reference to FIGS. 12 to 15, the insulation layer 16 has a laminated structure in which a plurality of insulation layers are laminated. The number of laminated layers of the insulation layer is arbitrary, and not limited to the specific number of laminated layers. In this embodiment, the insulation layer 16 includes a first insulation layer 51, a second insulation layer 52, a third insulation layer 53, a fourth insulation layer 54, and a fifth insulation layer 55.

The first to fourth insulation layers 51 to 54 preferably contain an inorganic insulation body. The first to fourth insulation layers 51 to 54 may contain silicon oxide or silicon nitride. In this embodiment, each of the first to third insulation layers 51 to 53 contains silicon oxide. The fourth insulation layer 54 preferably contains an insulation material which is different from the first to third insulation layers 51 to 53. In this embodiment, the fourth insulation layer 54 contains silicon nitride.

The uppermost fifth insulation layer 55 preferably contains an insulation material which is different from the first to fourth insulation layers 51 to 54. The uppermost fifth insulation layer 55 preferably contains an organic insulation body. The fifth insulation layer 55 may contain polyimide, polyamide, or polybenzoxazole serving as an example of the organic insulation body. The fourth insulation layer 54 and the fifth insulation layer 55 form the uppermost layer of the insulation layer 16, and are formed as protective layers for the lower layer structure. The fourth insulation layer 54 is also referred to as a passivation layer.

With reference to FIGS. 12 to 15, the semiconductor device 1 includes the base wiring 56, the gate wiring 57, the first source/drain wiring 58, and the second source/drain wiring 59 formed in the insulation layer 16.

With reference to FIG. 12, the base wiring 56 is selectively routed in the insulation layer 16, and electrically connects the base terminal 6 and the channel regions 40 (base layer 25). The base wiring 56 transmits the reference voltage applied to the base terminal 6 (for example, the ground voltage) to the base layer 25 and the channel regions 40. Specifically, the base wiring 56 includes a first lower wiring 61, a first intermediate wiring 62, a first upper wiring 63, a first lower via electrode 64, and a first upper via electrode 65.

The first lower wiring 61 is selectively formed on the first insulation layer 51. The first intermediate wiring 62 is selectively formed on the second insulation layer 52. The first upper wiring 63 is selectively formed on the third insulation layer 53. Each of the first lower wiring 61, the first intermediate wiring 62, and the first upper wiring 63 may include at least one of a pure Al layer, a pure Cu layer, an AlCu layer, an AlSi layer, and an AlSiCu layer.

The first lower via electrode 64 is embedded in the first insulation layer 51, and electrically connects an arbitrary region of the channel regions 40 and the first lower wiring 61. A plurality of first lower via electrodes 64 may be connected to the channel regions 40 in an arbitrary region of the semiconductor chip 15. For example, in a case in which a part of the channel region 40 is pulled out to the outside region 23, a single or plurality of first lower via electrodes 64 may be electrically connected to the channel regions 40 (base layer 25) in the outside region 23.

The first lower via electrode 64 includes a main body layer 66 and a barrier layer 67. The main body layer 66 is embedded in the first insulation layer 51. The main body layer 66 may include a W layer or a Cu layer. The barrier layer 67 is interposed between the first insulation layer 51 and the main body layer 66. The barrier layer 67 may include at least one of a Ti layer and a TiN layer.

The first upper via electrode 65 is embedded in the second insulation layer 52, and electrically connects an arbitrary region of the first intermediate wiring 62 and an arbitrary region of the first upper wiring 63. The first upper via electrode 65 includes a main body layer 66 and a barrier layer 67 like the first lower via electrode 64.

With reference to FIG. 13, the gate wiring 57 is selectively routed in the insulation layer 16, and electrically connects the gate terminal 7 and the gate electrode 34. The gate wiring 57 transmits the gate voltage VG applied to the gate terminal 7 to the gate electrode 34. Specifically, the gate wiring 57 includes a second lower wiring 71, a second intermediate wiring 72, a second upper wiring 73, a second lower via electrode 74, and a second upper via electrode 75.

The second lower wiring 71 is selectively formed on the first insulation layer 51. The second intermediate wiring 72 is selectively formed on the second insulation layer 52. The second upper wiring 73 is selectively formed on the third insulation layer 53. Each of the second lower wiring 71, the second intermediate wiring 72, and the second upper wiring 73 may include at least one of a pure Al layer, a pure Cu layer, an AlCu layer, an AlSi layer, and an AlSiCu layer.

The second lower via electrode 74 is embedded in the first insulation layer 51, and electrically connects the gate electrode 34 and the second lower wiring 71. The second lower via electrode 74 is electrically connected to the gate electrode 34 of the trench contact structure 37. The second lower via electrode 74 may be electrically connected to the gate electrode 34 of the trench gate structure 31. FIG. 13 shows, for convenience of description, the example in which a plurality of second lower via electrodes 74 are connected to the gate electrodes 34 of the trench gate structures 31. The second lower via electrode 74 includes a main body layer 66 and a barrier layer 67 like the first lower via electrode 64.

The second upper via electrode 75 is embedded in the second insulation layer 52, and electrically connects an arbitrary region of the second intermediate wiring 72 and an arbitrary region of the second upper wiring 73. The second upper via electrode 75 includes a main body layer 66 and a barrier layer 67 like the second lower via electrode 74.

With reference to FIG. 14, the first source/drain wiring 58 is selectively routed in the insulation layer 16, and electrically connects the first source/drain terminal 8 and the first source/drain regions 41. The first source/drain wiring 58 transmits the electric current I from the first source/drain terminal 8 to the first source/drain regions 41, or transmits the electric current I from the first source/drain regions 41 to the first source/drain terminal 8. Specifically, the first source/drain wiring 58 includes a third lower wiring 81, a third intermediate wiring 82, a third upper wiring 83, a third lower via electrode 84, and a third upper via electrode 85.

The third lower wiring 81 is selectively formed on the first insulation layer 51. The third intermediate wiring 82 is selectively formed on the second insulation layer 52. The third upper wiring 83 is selectively formed on the third insulation layer 53. Each of the third lower wiring 81, the third intermediate wiring 82, and the third upper wiring 83 may include at least one of a pure Al layer, a pure Cu layer, an AlCu layer, an AlSi layer, and an AlSiCu layer.

The third lower via electrode 84 is embedded in the first insulation layer 51, and electrically connects the first source/drain region 41 and the third lower wiring 81. In this embodiment, a plurality of third lower via electrodes 84 are respectively electrically connected to the corresponding first source/drain regions 41. The third lower via electrode 84 includes a main body layer 66 and a barrier layer 67 like the first lower via electrode 64.

The third upper via electrode 85 is embedded in the second insulation layer 52, and electrically connects an arbitrary region of the third intermediate wiring 82 and an arbitrary region of the third upper wiring 83. The third upper via electrode 85 includes a main body layer 66 and a barrier layer 67 like the third lower via electrode 84.

The first source/drain wiring 58 may include a plurality of third lower wirings 81. In this case, the plurality of third lower wirings 81 are formed at intervals in the first direction X, and respectively formed in a band shape extending in the second direction Y such as to cross the plurality of trench gate structures 31. Each of the third lower wirings 81 is formed on the plurality of first source/drain regions 41. Each of the third lower wirings 81 is electrically connected to the plurality of first source/drain regions 41 which are placed directly below the third lower wirings 81.

With reference to FIG. 15, the second source/drain wiring 59 is selectively routed in the insulation layer 16, and electrically connects the second source/drain terminal 9 and the second source/drain regions 42. The second source/drain wiring 59 transmits the electric current I from the second source/drain terminal 9 to the second source/drain regions 42, or transmits the electric current I from the second source/drain regions 42 to the second source/drain terminal 9. Specifically, the second source/drain wiring 59 includes a fourth lower wiring 91, a fourth intermediate wiring 92, a fourth upper wiring 93, a fourth lower via electrode 94, and a fourth upper via electrode 95.

The fourth lower wiring 91 is selectively formed on the first insulation layer 51. The fourth intermediate wiring 92 is selectively formed on the second insulation layer 52. The fourth upper wiring 93 is selectively formed on the third insulation layer 53. Each of the fourth lower wiring 91, the fourth intermediate wiring 92, and the fourth upper wiring 93 may include at least one of a pure Al layer, a pure Cu layer, an AlCu layer, an AlSi layer, and an AlSiCu layer.

The fourth lower via electrode 94 is embedded in the first insulation layer 51, and electrically connects the second source/drain region 42 and the fourth lower wiring 91. In this embodiment, a plurality of fourth lower via electrodes 94 are respectively electrically connected to the corresponding second source/drain regions 42. The fourth lower via electrode 94 includes a main body layer 66 and a barrier layer 67 like the first lower via electrode 64.

The fourth upper via electrode 95 is embedded in the second insulation layer 52, and electrically connects an arbitrary region of the fourth intermediate wiring 92 and an arbitrary region of the fourth upper wiring 93. The fourth upper via electrode 95 includes a main body layer 66 and a barrier layer 67 like the fourth lower via electrode 94.

The second source/drain wiring 59 may include a plurality of fourth lower wirings 91. In this case, the plurality of fourth lower wirings 91 are formed at intervals in the first direction X, and respectively formed in a band shape extending in the second direction Y such as to cross the plurality of trench gate structures 31. The plurality of fourth lower wirings 91 are formed in such a manner that they are arranged alternately with the plurality of third lower wirings 81 of the first source/drain wiring 58 along the first direction X in accordance with disposition of the first source/drain regions 41 and the second source/drain regions 42. Each of the fourth lower wirings 91 is formed on the plurality of second source/drain regions 42. Each of the fourth lower wirings 91 is electrically connected to the plurality of second source/drain regions 42 which are placed directly below the fourth lower wirings 91.

With reference to FIGS. 12 to 15, the base terminal 6, the gate terminal 7, the first source/drain terminal 8, and the second source/drain terminal 9 are respectively formed on the fifth insulation layer 55. The base terminal 6, the gate terminal 7, the first source/drain terminal 8, and the second source/drain terminal 9 pass through a part of the insulation layer 16 (which is the fourth insulation layer 54 and the fifth insulation layer 55).

The base terminal 6 is electrically connected to the first upper wiring 63 of the base wiring 56. The gate terminal 7 is electrically connected to the second upper wiring 73 of the gate wiring 57. The first source/drain terminal 8 is electrically connected to the third upper wiring 83 of the first source/drain wiring 58. The second source/drain terminal 9 is electrically connected to the fourth upper wiring 93 of the second source/drain wiring 59.

Each of the base terminal 6, the gate terminal 7, the first source/drain terminal 8, and the second source/drain terminal 9 includes an underlying electrode layer 96 and a low-melting-point metal layer 97. The underlaying electrode layer 96 is formed in a pad opening 98 passing through a part of the insulation layer 16 (which is the fourth insulation layer 54 and the fifth insulation layer 55). The underlying electrode layer 96 includes an overlapping portion pulled out from the pad opening 98 to the insulation main surface 20 of the insulation layer 16. The underlying electrode layer 96 may include at least one of a Ti layer, a TiN layer, a Cu layer, an Au layer, an Ni layer, and an Al layer.

The low-melting-point metal layer 97 is formed on the underlying electrode layer 96. The low-melting-point metal layer 97 covers the overlapping portion of the underlying electrode layer 96. The low-melting-point metal layer 97 projects from the insulation main surface 20 in a semi-spherical shape. The low-melting-point metal layer 97 may include a solder.

As described above, the semiconductor device 1 includes the semiconductor chip 15, the drift layer 24, the trench gate structures 31, the channel regions 40, the first source/drain regions 41, and the second source/drain regions 42. The drift layer 24 is formed in the surface layer portion of the first main surface 17 of the semiconductor chip 15. The trench gate structures 31 are formed in the first main surface 17 such as to be in contact with the drift layer 24.

The channel regions 40 are formed in the drift layer 24 such as to cover the side walls 35 of the trench gate structures 31. The first source/drain regions 41 and the second source/drain regions 42 are formed at intervals in the regions along the side walls 35 of the trench gate structures 31 in the drift layer 24 such as to oppose each other across the channel regions 40.

With such structures, the channels CH of the MISFET 2 are formed in the regions along the side walls 35 of the trench gate structures 31. Thereby, the electric current can flow along the side walls 35 of the trench gate structures 31. Therefore, it is possible to increase a current path, which makes it possible to improve an electric current capacity.

Additionally, with the semiconductor device 1, the channel regions 40 further cover the bottom walls 36 of the trench gate structures 31. With such structures, the channels CH of the MISFET 2 are also formed in regions along the bottom walls 36 of the trench gate structures 31. Thereby, it is possible to further increase the electric current capacity.

Figure 16:
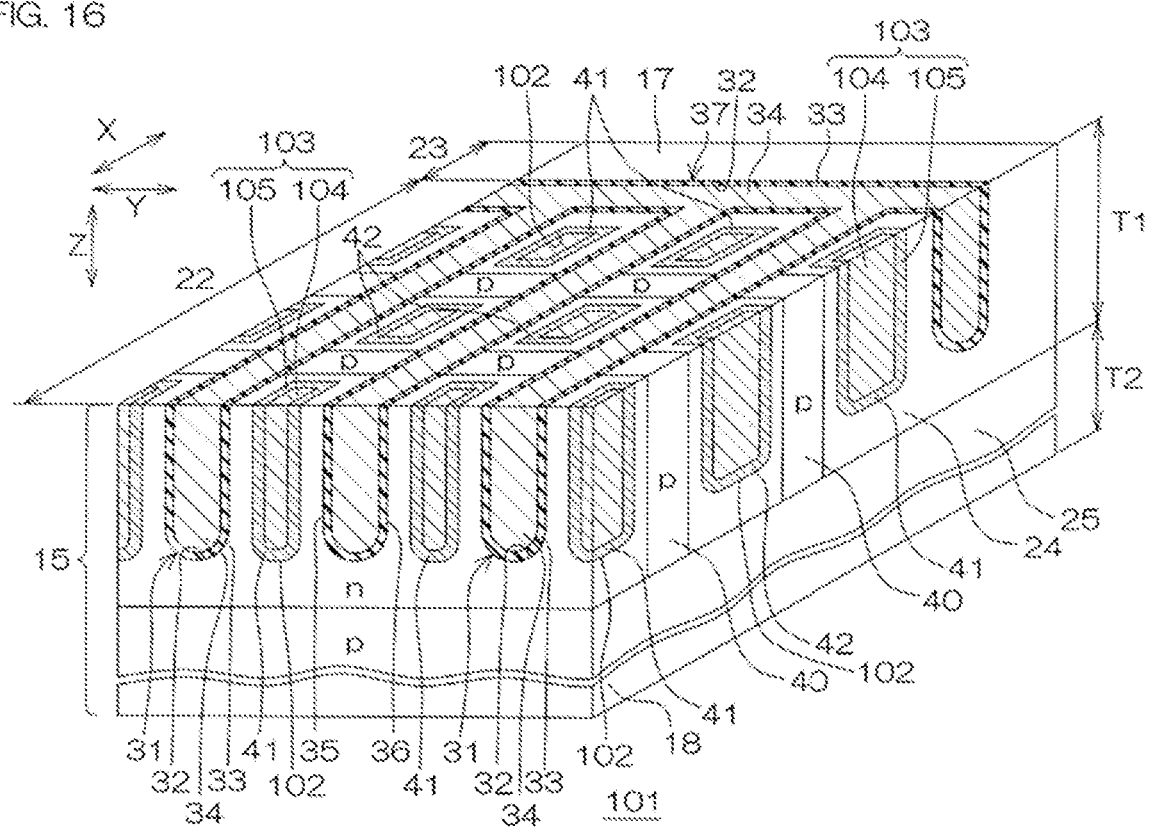
FIG. 16 is a view corresponding to FIG. 5, which is a perspective cross-sectional view of major portions showing a semiconductor device according to a second preferred embodiment of the present invention.

FIG. 16 is a view corresponding to FIG. 5, which is a perspective cross-sectional view of major portions showing a semiconductor device 101 according to a second preferred embodiment of the present invention. The semiconductor device 1 includes the first source/drain regions 41 and the second source/drain regions 42 each of which is formed by an impurity region. Meanwhile, the semiconductor device 101 includes first source/drain regions 41 and second source/drain regions 42 each of which is made of a metal material instead of the impurity region. Hereinafter, structures corresponding to the structures described for the semiconductor device 1 will be given the same reference signs and description thereof will be omitted.

Each of the first source/drain regions 41 and the second source/drain regions 42 has a trench electrode structure including a trench 102 and a metal electrode 103. The trench 102 is formed by digging a first main surface 17 to the side of a second main surface 18. The trench 102 exposes a drift layer 24.

A bottom portion of the trench 102 is formed in a region on the first main surface 17 side with respect to a bottom portion of the drift layer 24. The bottom portion of the trench 102 may be formed at a depth position between the bottom portion of the drift layer 24 and a bottom wall 36 of a trench gate structure 31. The bottom portion of the trench 102 may be formed at a depth position between the first main surface 17 and the bottom wall 36 of the trench gate structure 31. From the viewpoint of increasing the channel length of a channel CH, the trench 102 is preferably formed with a thickness that crosses at least an intermediate portion of each of the trench gate structures 31.

The metal electrode 103 is embedded in the trench 102. The metal electrode 103 is electrically connected to the drift layer 24 in the trench 102. The metal electrode 103 may include a main body layer 104 and a barrier layer 105.

The main body layer 104 is embedded in the trench 102. The main body layer 104 may include at least one of a W layer, a pure Al layer, a pure Cu layer, an AlCu layer, an AlSi layer, and an AlSiCu layer. The barrier layer 105 is interposed between the drift layer 24 and the main body layer 104. The barrier layer 105 may include at least one of a Ti layer and a TiN layer. The first source/drain region 41 may also serve as the third lower via electrode 84 according to the first preferred embodiment. The second source/drain region 42 may also serve as the fourth lower via electrode 94 according to the first preferred embodiment.

As described above, even with the semiconductor device 101, it is possible to obtain the same effects as the effects described for the semiconductor device 1.

The present invention can be further implemented in other embodiments.

In each of the preferred embodiments described above, the example in which the first conductivity type is an n-type and the second conductivity type is a p-type is described. However, the first conductivity type may be a p-type and the second conductivity type may be an n-type. Specific arrangements of this case are obtained by replacing the n-type regions with p-type regions and replacing the p-type regions with n-type regions in the description above and the attached drawings.

In each of the preferred embodiments described above, the example in which the semiconductor chip 15 made of silicon is adopted is described. However, in each of the preferred embodiments described above, a semiconductor chip 15 constituted of a wide bandgap semiconductor may be adopted. The semiconductor chip 15 may be made of SiC (silicon carbide) serving as an example of the wide bandgap semiconductor. The semiconductor chip 15 may be constituted of a SiC monocrystal constituted of a hexagonal crystal.

The SiC monocrystal constituted of a hexagonal crystal has a plurality of polytypes including 2H (Hexagonal)-SiC monocrystal, 4H—SiC monocrystal, and 6H—SiC monocrystal in accordance with the cycle of the atomic arrangement. The semiconductor chip 15 is preferably constituted of a 4H—SiC monocrystal among the plurality of polytypes.

In this case, preferably, the first main surface 17 is formed by a (0001) plane (silicon plane) of the SiC monocrystal, and the second main surface 18 is formed by a (000-1) plane (carbon plane) of the SiC monocrystal. Of course, the first main surface 17 may be formed by the (000-1) plane, and the second main surface 18 may be formed by the (0001) plane. Each of the (0001) plane and the (000-1) plane of the SiC monocrystal is referred to as a c plane. The normal direction Z of the c plane of the SiC monocrystal is referred to as the c-axis ([0001] direction).

The first main surface 17 may have an off angle with which the first main surface 17 is inclined at a predetermined angle in the predetermined off direction with respect to the c plane of the SiC monocrystal. The off direction is preferably the [11-20] direction of the SiC monocrystal. The off angle may be not less than 0° and not more than 10°. The off angle is preferably not less than 0° and not more than 5.0°. The off angle may be set within an angle range of not less than 0° and not more than 1.0°, not less than 1.0° and not more than 2.0°, not less than 2.0° and not more than 3.0°, not less than 3.0° and not more than 4.0°, or not less than 4.0° and not more than 5.0°.

The plurality of trench gate structures 31 are preferably respectively formed in a band shape extending along an m-axis direction of the SiC monocrystal, and formed at intervals in an a-axis direction of the SiC monocrystal. Of course, the plurality of trench gate structures 31 may be respectively formed in a band shape extending along the a-axis direction of the SiC monocrystal, and formed at intervals in the m-axis direction of the SiC monocrystal. The m-axis direction is the [1-100] direction and the [−1100] direction of the SiC monocrystal. The a-axis direction is the [11-20] direction and the [−1-120] direction of the SiC monocrystal.

In each of the preferred embodiments described above, the example in which the semiconductor device 1, 101 includes the chip size package is described. However, in each of the preferred embodiments described above, the semiconductor device 1, 101 does not necessarily have to include the chip size package. The design of the semiconductor device 1, 101 may be changed to a proper mode such as to be assembled in various semiconductor packages.

SOP (Small Outline Package), TO (Transistor Outline), QFN (Quad For Non Lead Package), DFP (Dual Flat Package), DIP (Dual Inline Package), QFP (Quad Flat Package), SIP (Single Inline Package), or SOJ (Small Outline J-leaded Package), or various modes similar to these packages can be shown as examples of the semiconductor packages.

Hereinafter, examples of features extracted from this description and the drawings will be shown.

[A1] A semiconductor device comprising: a semiconductor chip having a main surface; a first conductivity type drift layer formed in a surface layer portion of the main surface; a trench gate structure formed in the main surface such as to be in contact with the drift layer; a second conductivity type channel region formed in the drift layer such as to cover a side wall of the trench gate structure; and first and second source/drain regions formed at intervals in a region along the side wall of the trench gate structure in the drift layer such as to oppose each other across the channel region.

[A2] The semiconductor device according to A1, wherein the channel region further covers a bottom wall of the trench gate structure.

[A3] The semiconductor device according to A1 or A2, further comprising: a first pn-junction portion formed in a region between the channel region and the first source/drain region; and a second pn-junction portion formed in a region between the channel region and the second source/drain region, and connected in a reverse-biased manner to the first pn-junction portion via the channel region.

[A4] The semiconductor device according to any one of A1 to A3, wherein the first source/drain region and the second source/drain region are formed at intervals from the channel region.

[A5] The semiconductor device according to any one of A1 to A4, wherein the first source/drain region and the second source/drain region are formed at intervals from the trench gate structure.

[A6] The semiconductor device according to any one of A1 to A5, wherein the channel region intersects the trench gate structure.

[A7] The semiconductor device according to any one of A1 to A6, wherein the trench gate structure extends in a band shape in a plan view, a plurality of the channel regions are formed at intervals along the trench gate structure, and a plurality of the first source/drain regions and a plurality of the second source/drain regions are formed alternately along the trench gate structure such as to sandwich one of the channel regions.

[A8] The semiconductor device according to any one of A1 to A7, wherein a plurality of the trench gate structures are formed at intervals, and the channel region, the first source/drain region, and the second source/drain region are formed in a region between the plurality of trench gate structures.

[A9] The semiconductor device according to any one of A1 to A8, wherein the trench gate structure is formed in an annular shape in a plan view, and the channel region, the first source/drain region, and the second source/drain region are formed in a region surrounded by the trench gate structure.

[A10] The semiconductor device according to any one of A1 to A9, wherein a first voltage is applied to the first source/drain region, and a second voltage which is different from the first voltage is applied to the second source/drain region.

[A11] The semiconductor device according to any one of A1 to A10, wherein a reference voltage is applied to the channel region.

[A12] The semiconductor device according to any one of A1 to A11, further comprising: a first terminal formed on the main surface and electrically connected to the trench gate structure; a second terminal formed on the main surface and electrically connected to the channel region; a third terminal formed on the main surface and electrically connected to the first source/drain region; and a fourth terminal formed on the main surface and electrically connected to the second source/drain region.

[A13] The semiconductor device according to A12, further comprising: an insulation layer covering the main surface; wherein the first terminal, the second terminal, the third terminal, and the fourth terminal are formed on the insulation layer.

[A14] The semiconductor device according to A13, further comprising: a first wiring formed in the insulation layer and electrically connected to the trench gate structure and the first terminal; a second wiring formed in the insulation layer and electrically connected to the channel region and the second terminal; a third wiring formed in the insulation layer and electrically connected to the first source/drain region and the third terminal; and a fourth wiring formed in the insulation layer and electrically connected to the second source/drain region and the fourth terminal.

[A15] The semiconductor device according to A13 or A14, wherein the semiconductor chip has a side surface, and the insulation layer has an insulation side surface continuous to the side surface.

[A16] The semiconductor device according to any one of A1 to A15, wherein the drift layer is formed by an epitaxial layer.

[A17] The semiconductor device according to any one of A1 to A16, wherein each of the first source/drain region and the second source/drain region is constituted of a first conductivity type impurity region.

[A18] The semiconductor device according to any one of A1 to A16, wherein each of the first source/drain region and the second source/drain region is made of a metal material.

[A19] The semiconductor device according to any one of A1 to A18, wherein the semiconductor chip is made of silicon or silicon carbide.

[A20] The semiconductor device according to any one of A1 to A19, wherein the semiconductor device is constituted of a chip size package.

This application corresponds to Japanese Patent Application No. 2019-180862 filed in the Japan Patent Office on Sep. 30, 2019, the entire disclosure of which is incorporated herein by reference. Although the preferred embodiments of the present invention have been described in detail, these are merely concrete examples used to clarify the technical contents of the present invention, and the present invention should not be understood by being limited to these concrete examples, and the scope of the present invention is limited solely by the appended claims.

REFERENCE SIGNS LIST 1 semiconductor device
6 base terminal
7 gate terminal
8 first source/drain terminal 9 second source/drain terminal
11 device main body
15 semiconductor chip
16 insulation layer
17 first main surface
19A first side surface
19B second side surface
19C third side surface
19D fourth side surface
20 insulation main surface
21A first insulation side surface
21B second insulation side surface
21C third insulation side surface
21D fourth insulation side surface
24 drift layer
31 trench gate structure
35 side wall
36 bottom wall
40 channel region
41 first source/drain region
42 second source/drain region
43 first pn-junction portion
44 second pn-junction portion
101 semiconductor device

The invention claimed is:

1. A semiconductor device comprising:
a semiconductor chip having a main surface;
a first conductivity type drift layer formed in a surface layer portion of the main surface;
a trench gate structure formed in the main surface such as to be in contact with the drift layer;
a second conductivity type channel region formed in the drift layer such as to cover a side wall of the trench gate structure; and
first and second source/drain regions formed at intervals in a region along the side wall of the trench gate structure in the drift layer such as to oppose each other across the channel region, wherein the channel region further covers a bottom wall of the trench gate structure.

2. The semiconductor device according to claim 1, further comprising:
a first pn-junction portion formed in a region between the channel region and the first source/drain region; and
a second pn-junction portion formed in a region between the channel region and the second source/drain region, and connected in a reverse-biased manner to the first pn-junction portion via the channel region.

3. The semiconductor device according to claim 1, wherein
the first and second source/drain regions are formed at intervals from the channel region.

4. The semiconductor device according to claim 1, wherein
the first and second source/drain regions are formed at intervals from the trench gate structure.

5. The semiconductor device according to claim 1, wherein
the channel region intersects the trench gate structure.

6. A semiconductor device comprising:
a semiconductor chip having a main surface;
a first conductivity type drift layer formed in a surface layer portion of the main surface;
a trench gate structure formed in the main surface such as to be in contact with the drift layer;
a second conductivity type channel region formed in the drift layer such as to cover a side wall of the trench gate structure; and
first and second source/drain regions formed at intervals in a region along the side wall of the trench gate structure in the drift layer such as to oppose each other across the channel region, wherein
the trench gate structure extends in a band shape in a plan view,
a plurality of the channel regions are formed at intervals along the trench gate structure, and
a plurality of the first source/drain regions and a plurality of the second source/drain regions are formed alternately along the trench gate structure such as to sandwich one of the channel regions.

7. The semiconductor device according to claim 6, wherein
a plurality of the trench gate structures are formed at intervals, and
the channel region, the first source/drain region, and the second source/drain region are formed in a region between the plurality of trench gate structures.

8. The semiconductor device according to claim 6, wherein
the trench gate structure is formed in an annular shape in a plan view, and
the channel region, the first source/drain region, and the second source/drain region are formed in a region surrounded by the trench gate structure.

9. The semiconductor device according to claim 6, wherein
a first voltage is applied to the first source/drain region, and
a second voltage which is different from the first voltage is applied to the second source/drain region.

10. The semiconductor device according to claim 6, wherein
a reference voltage is applied to the channel region.

11. The semiconductor device according to claim 6, further comprising:
a first terminal formed on the main surface and electrically connected to the trench gate structure;
a second terminal formed on the main surface and electrically connected to the channel region;
a third terminal formed on the main surface and electrically connected to the first source/drain region; and
a fourth terminal formed on the main surface and electrically connected to the second source/drain region.

12. The semiconductor device according to claim 11, further comprising:
an insulation layer covering the main surface, wherein
the first terminal, the second terminal, the third terminal, and the fourth terminal are formed on the insulation layer.

13. The semiconductor device according to claim 12, further comprising:
a first wiring formed in the insulation layer and electrically connected to the trench gate structure and the first terminal;
a second wiring formed in the insulation layer and electrically connected to the channel region and the second terminal;
a third wiring formed in the insulation layer and electrically connected to the first source/drain region and the third terminal; and a fourth wiring formed in the insulation layer and electrically connected to the second source/drain region and the fourth terminal.

14. The semiconductor device according to claim 12, wherein
the semiconductor chip has a side surface, and
the insulation layer has an insulation side surface continuous to the side surface.

15. The semiconductor device according to claim 6, wherein
the drift layer is formed by an epitaxial layer.

16. The semiconductor device according to claim 6, wherein
each of the first source/drain region and the second source/drain region is constituted of a first conductivity type impurity region.

17. The semiconductor device according to claim 6, wherein
each of the first source/drain region and the second source/drain region is made of a metal material.

18. The semiconductor device according to claim 6, wherein
the semiconductor chip is made of silicon or silicon carbide.

19. The semiconductor device according to claim 6, wherein
the semiconductor device is constituted of a chip size package.

* * * * *